(12) United States Patent
Zeigler et al.

(10) Patent No.: US 12,065,019 B2
(45) Date of Patent: *Aug. 20, 2024

(54) REFRIGERANT SYSTEM FOR COOLING ELECTRONICS

(71) Applicant: Bergstrom, Inc., Rockford, IL (US)

(72) Inventors: Terry Zeigler, Byron, IL (US); Brett S. Connell, Winnebago, IL (US)

(73) Assignee: Bergstrom, Inc., Rockford, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/948,999

(22) Filed: Sep. 20, 2022

(65) Prior Publication Data

US 2023/0078956 A1 Mar. 16, 2023

Related U.S. Application Data

(63) Continuation of application No. 16/046,711, filed on Jul. 26, 2018, now Pat. No. 11,448,441.
(Continued)

(51) Int. Cl.
*B60H 1/00* (2006.01)
*B60H 1/32* (2006.01)
(Continued)

(52) U.S. Cl.
CPC ....... *B60H 1/3213* (2013.01); *B60H 1/00985* (2013.01); *F25B 25/005* (2013.01);
(Continued)

(58) Field of Classification Search
CPC ............... B60J 1/00271; B60J 1/00985; B60J 1/00278; B60J 1/0089; F25B 2600/0253;
(Continued)

(56) References Cited

U.S. PATENT DOCUMENTS 2,722,050 A 11/1955 Shank
2,789,234 A 6/1956 Lambert et al.
(Continued)

FOREIGN PATENT DOCUMENTS

CN 1468409 A 1/2004
CN 2883071 Y 3/2007
(Continued)

OTHER PUBLICATIONS

Alfa Laval Website http://www.alfalaval.com/ecore-Java/WebObjects/ecoreJava.woa/wa/shoNode?siteNodelID=1668&cont . . . ; date last visited May 18, 2007; 1 page.
(Continued)

*Primary Examiner* — Brian M King
(74) *Attorney, Agent, or Firm* — Morgan, Lewis & Bockius LLP

(57) ABSTRACT

The various implementations described herein include methods, devices, and systems for cooling a vehicular electronics system. In one aspect, a vehicular refrigerant system includes: (1) a refrigerant loop having a compressor configured to compress a refrigerant, a condenser configured to condense the compressed refrigerant, an expansion device configured to enable expansion of the condensed refrigerant, and a heat exchanger configured to transfer heat from a liquid coolant to the expanded refrigerant; (2) a liquid coolant loop configured to transfer heat from an electronics system via the liquid coolant; and (3) a controller configured to: (a) obtain operating data regarding the refrigerant, the liquid coolant, and/or the electronics system; and (b) adjust operation of the refrigerant loop and/or the liquid coolant loop based on the obtained operating data.

21 Claims, 15 Drawing Sheets

Related U.S. Application Data

(60) Provisional application No. 62/537,864, filed on Jul. 27, 2017.

(51) Int. Cl.
*F25B 25/00* (2006.01)
*F25B 49/02* (2006.01)
*H05K 7/20* (2006.01)

(52) U.S. Cl.
CPC ......... *F25B 49/02* (2013.01); *H05K 7/20881* (2013.01); *F25B 2600/0253* (2013.01); *F25B 2600/111* (2013.01); *F25B 2600/13* (2013.01); *F25B 2700/15* (2013.01); *F25B 2700/195* (2013.01); *F25B 2700/21163* (2013.01); *F25B 2700/21171* (2013.01)

(58) Field of Classification Search
CPC ................ F25B 25/005; F25B 2700/19; F25B 2700/21; F25B 2600/02; F25B 2600/024; B60H 1/00271; B60H 1/00985; B60H 1/00278; B60H 1/0089
See application file for complete search history.

(56) References Cited

U.S. PATENT DOCUMENTS

| | | |
|---|---|---|
| 3,176,502 A | 4/1965 | Cizek et al. |
| 3,225,819 A | 12/1965 | Stevens |
| 3,360,958 A | 1/1968 | Miner |
| 3,590,910 A | 7/1971 | Lorenz |
| 3,627,030 A | 12/1971 | Lorenz |
| 3,807,087 A | 4/1974 | Staats |
| 3,844,130 A | 10/1974 | Wahnish |
| 3,880,224 A | 4/1975 | Weil |
| 3,885,398 A | 5/1975 | Dawkins |
| 3,938,349 A | 2/1976 | Ueno |
| 3,948,060 A | 4/1976 | Gaspard |
| 3,995,443 A | 12/1976 | Iversen |
| 4,015,182 A | 3/1977 | Erdman |
| 4,034,801 A | 7/1977 | Bermstein |
| 4,071,080 A | 1/1978 | Bridgers |
| 4,217,764 A | 8/1980 | Armbruster |
| 4,266,405 A | 5/1981 | Trask |
| 4,271,677 A | 6/1981 | Harr |
| 4,280,330 A | 7/1981 | Harris et al. |
| 4,324,286 A | 4/1982 | Brett |
| 4,359,875 A | 11/1982 | Ohtani |
| 4,383,802 A | 5/1983 | Gianni et al. |
| 4,391,321 A | 7/1983 | Thunberg |
| 4,412,425 A | 11/1983 | Fukami et al. |
| 4,448,157 A | 5/1984 | Eckstein et al. |
| 4,459,519 A | 7/1984 | Erdman |
| 4,577,679 A | 3/1986 | Hibshman |
| 4,604,036 A | 8/1986 | Sutou et al. |
| 4,617,472 A | 10/1986 | Slavik |
| 4,641,502 A | 2/1987 | Aldrich et al. |
| 4,658,593 A | 4/1987 | Stenvinkel |
| 4,667,480 A | 5/1987 | Bessler |
| 4,694,798 A | 9/1987 | Kato et al. |
| 4,748,825 A | 6/1988 | King |
| 4,825,663 A | 5/1989 | Nijar et al. |
| 4,841,733 A | 6/1989 | Dussault et al. |
| 4,856,078 A | 8/1989 | Konopka |
| 4,893,479 A | 1/1990 | Gillett et al. |
| 4,897,798 A | 1/1990 | Cer |
| 4,905,478 A | 3/1990 | Matsuda et al. |
| 4,945,977 A | 8/1990 | D'Agaro |
| 4,947,657 A | 8/1990 | Kalmbach |
| 4,952,283 A | 8/1990 | Besik |
| 4,982,576 A | 1/1991 | Proctor et al. |
| 5,025,634 A | 6/1991 | Dressler |
| 5,046,327 A | 9/1991 | Walker |
| 5,067,652 A | 11/1991 | Enander |
| 5,095,308 A | 3/1992 | Hewitt |
| 5,125,236 A | 6/1992 | Clancey et al. |
| 5,170,639 A | 12/1992 | Datta |
| 5,205,781 A | 4/1993 | Kanno et al. |
| 5,230,719 A | 7/1993 | Berner et al. |
| 5,275,012 A | 1/1994 | Dage et al. |
| 5,307,645 A | 5/1994 | Pannell |
| 5,316,074 A | 5/1994 | Isaji et al. |
| 5,324,229 A | 6/1994 | Weisbecker |
| 5,327,997 A | 7/1994 | Nash, Jr. et al. |
| 5,333,678 A | 8/1994 | Mellum et al. |
| 5,361,593 A | 11/1994 | Dauvergne |
| 5,376,866 A | 12/1994 | Erdman |
| 5,396,779 A | 3/1995 | Voss |
| 5,402,844 A | 4/1995 | Elluin |
| 5,404,730 A | 4/1995 | Westermeyer |
| 5,426,953 A | 6/1995 | Meckler |
| 5,465,589 A | 11/1995 | Bender et al. |
| 5,497,941 A | 3/1996 | Numazawa et al. |
| 5,501,267 A | 3/1996 | Iritani et al. |
| 5,502,365 A | 3/1996 | Nanbu et al. |
| 5,524,442 A | 6/1996 | Bergmen, Jr. et al. |
| 5,528,901 A | 6/1996 | Willis |
| 5,562,538 A | 10/1996 | Suyama |
| 5,586,613 A | 12/1996 | Ehsani |
| 5,605,058 A | 2/1997 | Kurachi et al. |
| 5,647,534 A | 7/1997 | Kelz et al. |
| 5,657,638 A | 8/1997 | Erdman et al. |
| 5,682,757 A | 11/1997 | Peterson |
| 5,720,181 A | 2/1998 | Karl et al. |
| 5,752,391 A | 5/1998 | Ozaki et al. |
| 5,761,918 A | 6/1998 | Jackson et al. |
| 5,775,415 A | 7/1998 | Yoshini et al. |
| 5,782,610 A | 7/1998 | Ikeda |
| 5,819,549 A | 10/1998 | Sherwood |
| 5,896,750 A | 4/1999 | Karl |
| 5,898,995 A | 5/1999 | Ghodbane |
| 5,899,081 A | 5/1999 | Evans et al. |
| 5,901,572 A | 5/1999 | Peiffer et al. |
| 5,901,780 A | 5/1999 | Zeigler et al. |
| 5,921,092 A | 7/1999 | Behr et al. |
| 5,934,089 A | 8/1999 | Magakawa et al. |
| 5,982,643 A | 11/1999 | Phlipot |
| 5,996,363 A | 12/1999 | Kurachi et al. |
| 6,016,662 A | 1/2000 | Tanaka et al. |
| 6,021,043 A | 2/2000 | Horng |
| 6,028,406 A | 2/2000 | Birk |
| 6,029,465 A | 2/2000 | Bascobert |
| 6,038,877 A | 3/2000 | Peiffer et al. |
| 6,038,879 A | 3/2000 | Turcotte |
| 6,059,016 A | 5/2000 | Rafalovich et al. |
| 6,072,261 A | 6/2000 | Lin |
| 6,073,456 A | 6/2000 | Kawai et al. |
| 6,111,731 A | 8/2000 | Cepynsky |
| 6,112,535 A | 9/2000 | Hollenbeck |
| 6,122,929 A | 9/2000 | Yamasaki |
| 6,125,642 A | 10/2000 | Seener et al. |
| 6,134,901 A | 10/2000 | Harvest et al. |
| 6,152,217 A | 11/2000 | Ito et al. |
| 6,185,959 B1 | 2/2001 | Zajac |
| 6,193,475 B1 | 2/2001 | Rozek |
| 6,205,795 B1 | 3/2001 | Backman et al. |
| 6,205,802 B1 | 3/2001 | Drucker et al. |
| 6,209,333 B1 | 4/2001 | Bascobert |
| 6,209,622 B1 | 4/2001 | Lagace et al. |
| 6,213,867 B1 | 4/2001 | Yazici |
| 6,230,507 B1 | 5/2001 | Ban et al. |
| 6,253,563 B1 | 7/2001 | Ewert et al. |
| 6,265,692 B1 | 7/2001 | Umebayahi et al. |
| 6,276,161 B1 | 8/2001 | Peiffer et al. |
| 6,282,919 B1 | 9/2001 | Rockenfeller |
| 6,318,103 B1 | 11/2001 | Rieger et al. |
| 6,351,957 B2 | 3/2002 | Hara |
| 6,405,793 B1 | 6/2002 | Ghodbane et al. |
| 6,411,059 B2 | 6/2002 | Frugier et al. |
| 6,453,678 B1 | 9/2002 | Sundhar |
| 6,457,324 B2 | 10/2002 | Zeigler et al. |
| 6,467,279 B1 | 10/2002 | Backman et al. |
| 6,474,081 B1 | 11/2002 | Feuerecker |
| 6,530,426 B1 | 3/2003 | Kishita et al. |

(56) References Cited

U.S. PATENT DOCUMENTS

| | | |
|---|---|---|
| 6,543,245 B1 | 4/2003 | Waldschmidt |
| 6,571,566 B1 | 6/2003 | Temple et al. |
| 6,575,228 B1 | 6/2003 | Ragland et al. |
| 6,626,003 B1 | 9/2003 | Kortüm et al. |
| 6,675,601 B2 | 1/2004 | Ebara |
| 6,684,863 B2 | 2/2004 | Dixon et al. |
| 6,725,134 B2 | 4/2004 | Dillen et al. |
| 6,745,585 B2 | 6/2004 | Kelm et al. |
| 6,748,750 B2 | 6/2004 | Choi |
| 6,758,049 B2 | 7/2004 | Adachi et al. |
| 6,889,762 B2 | 5/2005 | Zeigler et al. |
| 6,932,148 B1 | 8/2005 | Brummett et al. |
| 6,939,114 B2 | 9/2005 | Iwanami et al. |
| 6,965,818 B2 | 11/2005 | Koenig et al. |
| 6,981,544 B2 | 1/2006 | Iwanami et al. |
| 6,992,419 B2 | 1/2006 | Kim et al. |
| 7,131,281 B2 | 11/2006 | Salim et al. |
| 7,135,799 B2 | 11/2006 | Rittmeyer |
| 7,150,159 B1 | 12/2006 | Brummett et al. |
| 7,246,502 B2 | 7/2007 | Hammonds et al. |
| 7,316,119 B2 | 1/2008 | Allen |
| 7,350,368 B2 | 4/2008 | Heberle et al. |
| 7,385,323 B2 | 6/2008 | Takahashi et al. |
| 7,591,143 B2 | 9/2009 | Zeigler et al. |
| 7,591,303 B2 | 9/2009 | Ziegler et al. |
| 7,614,242 B1 | 11/2009 | Quesada Saborio |
| 7,637,031 B2 | 12/2009 | Salim et al. |
| 7,765,824 B2 | 8/2010 | Wong et al. |
| 7,821,175 B2 | 10/2010 | Ionel et al. |
| 7,932,658 B2 | 4/2011 | Ionel |
| 8,001,799 B2 | 8/2011 | Obayashi et al. |
| 8,141,377 B2 | 3/2012 | Connell |
| 8,156,754 B2 | 4/2012 | Hong et al. |
| 8,276,892 B2 | 10/2012 | Narikawa et al. |
| 8,492,948 B2 | 7/2013 | Wang et al. |
| 8,517,087 B2 | 8/2013 | Zeigler et al. |
| 8,821,092 B2 | 9/2014 | Nambara et al. |
| 8,841,813 B2 | 9/2014 | Junak et al. |
| 8,905,071 B2 | 12/2014 | Coombs et al. |
| 8,919,140 B2 | 12/2014 | Johnson et al. |
| 8,947,531 B2 | 2/2015 | Fischer et al. |
| 9,157,670 B2 | 10/2015 | Kreeley et al. |
| 9,216,628 B2 | 12/2015 | Self et al. |
| 9,221,409 B1 | 12/2015 | Gauthier et al. |
| 9,327,578 B2 * | 5/2016 | Itoh .................. B60H 1/00064 |
| 9,670,933 B2 | 6/2017 | Yoo et al. |
| 9,783,024 B2 | 10/2017 | Connell et al. |
| 9,878,591 B2 | 1/2018 | Taniguchi et al. |
| 10,267,546 B2 | 4/2019 | Evans et al. |
| 2001/0010261 A1 | 8/2001 | Oomura et al. |
| 2002/0020183 A1 | 2/2002 | Hayashi |
| 2002/0026801 A1 | 3/2002 | Yamashita |
| 2002/0036081 A1 | 3/2002 | Ito et al. |
| 2002/0042248 A1 | 4/2002 | Vincent et al. |
| 2002/0078700 A1 | 6/2002 | Kelm et al. |
| 2002/0078705 A1 | 6/2002 | Schlosser et al. |
| 2002/0084769 A1 | 7/2002 | Iritani et al. |
| 2002/0108384 A1 | 8/2002 | Higashiyama |
| 2002/0112489 A1 | 8/2002 | Egawa et al. |
| 2002/0157412 A1 | 10/2002 | Iwanami et al. |
| 2002/0157413 A1 | 10/2002 | Iwanami et al. |
| 2003/0041603 A1 | 3/2003 | Tada et al. |
| 2003/0105567 A1 | 6/2003 | Koenig et al. |
| 2003/0106332 A1 | 6/2003 | Okamoto |
| 2004/0060312 A1 | 4/2004 | Horn et al. |
| 2004/0079098 A1 | 4/2004 | Uno et al. |
| 2004/0112074 A1 | 6/2004 | Komura et al. |
| 2004/0168449 A1 | 9/2004 | Homan et al. |
| 2004/0216477 A1 | 11/2004 | Yamasaki et al. |
| 2004/0221599 A1 | 11/2004 | Hille et al. |
| 2004/0250560 A1 | 12/2004 | Ikura et al. |
| 2004/0256082 A1 | 12/2004 | Bracciano |
| 2005/0016196 A1 | 1/2005 | Kadle et al. |
| 2005/0109499 A1 | 5/2005 | Iwanami et al. |
| 2005/0161211 A1 | 7/2005 | Zeigler et al. |
| 2005/0230096 A1 | 10/2005 | Yamaoka |
| 2005/0235660 A1 | 10/2005 | Pham |
| 2005/0257545 A1 | 11/2005 | Ziehr et al. |
| 2006/0042284 A1 | 3/2006 | Heberle et al. |
| 2006/0080980 A1 | 4/2006 | Lee et al. |
| 2006/0102333 A1 | 5/2006 | Zeigler et al. |
| 2006/0118290 A1 | 6/2006 | Klassen et al. |
| 2006/0151163 A1 | 7/2006 | Zeigler et al. |
| 2006/0151164 A1 | 7/2006 | Zeigler et al. |
| 2006/0254309 A1 | 11/2006 | Takeuchi et al. |
| 2006/0277936 A1 | 12/2006 | Norden et al. |
| 2007/0070605 A1 | 3/2007 | Straznicky et al. |
| 2007/0101760 A1 | 5/2007 | Bergander |
| 2007/0103014 A1 | 5/2007 | Sumiya et al. |
| 2007/0131408 A1 * | 6/2007 | Zeigler .............. B60H 1/00378 |
| | | 62/236 |
| 2007/0144723 A1 | 6/2007 | Aubertin et al. |
| 2007/0144728 A1 | 6/2007 | Kinmartin et al. |
| 2007/0163276 A1 | 7/2007 | Braun et al. |
| 2007/0227167 A1 | 10/2007 | Shapiro |
| 2007/0251256 A1 | 11/2007 | Pham et al. |
| 2007/0295017 A1 | 12/2007 | Pannell |
| 2008/0017347 A1 | 1/2008 | Chung et al. |
| 2008/0110185 A1 | 5/2008 | Veettil et al. |
| 2008/0156887 A1 | 7/2008 | Stanimirovic |
| 2008/0196436 A1 | 8/2008 | Connell |
| 2008/0196877 A1 | 8/2008 | Zeigler et al. |
| 2008/0209924 A1 | 9/2008 | Yoon et al. |
| 2008/0295535 A1 * | 12/2008 | Robinet .............. H01M 10/663 |
| | | 62/259.2 |
| 2009/0140590 A1 | 6/2009 | Hung |
| 2009/0211280 A1 | 8/2009 | Alston |
| 2009/0229288 A1 | 9/2009 | Alston et al. |
| 2009/0241592 A1 | 10/2009 | Stover |
| 2009/0249802 A1 | 10/2009 | Nemesh et al. |
| 2009/0301702 A1 | 12/2009 | Zeigler et al. |
| 2010/0009620 A1 | 1/2010 | Kawato et al. |
| 2010/0019047 A1 | 1/2010 | Flick |
| 2010/0127591 A1 | 5/2010 | Court et al. |
| 2010/0186433 A1 | 7/2010 | Galante et al. |
| 2010/0218530 A1 | 9/2010 | Melbostad et al. |
| 2010/0263395 A1 | 10/2010 | Adachi et al. |
| 2010/0281901 A1 | 11/2010 | Kawase et al. |
| 2010/0293966 A1 | 11/2010 | Yokomachi |
| 2010/0297517 A1 * | 11/2010 | Maier .............. H01M 8/04014 |
| | | 429/439 |
| 2011/0000240 A1 * | 1/2011 | Yamada ............. F25B 49/005 |
| | | 62/190 |
| 2011/0088417 A1 | 4/2011 | Kayser |
| 2011/0120146 A1 | 5/2011 | Ota et al. |
| 2011/0126566 A1 | 6/2011 | Jones et al. |
| 2011/0174014 A1 | 7/2011 | Scarcella et al. |
| 2011/0308265 A1 | 12/2011 | Phannavong |
| 2012/0023982 A1 | 2/2012 | Berson et al. |
| 2012/0102779 A1 | 5/2012 | Beers et al. |
| 2012/0118532 A1 | 5/2012 | Jentzsch et al. |
| 2012/0133176 A1 | 5/2012 | Ramberg |
| 2012/0247135 A1 | 10/2012 | Fakieh |
| 2012/0297805 A1 | 11/2012 | Kamada et al. |
| 2012/0318014 A1 | 12/2012 | Huff et al. |
| 2013/0040549 A1 | 2/2013 | Douglas et al. |
| 2013/0091867 A1 | 4/2013 | Campbell et al. |
| 2013/0145781 A1 | 6/2013 | Liu |
| 2013/0167577 A1 | 7/2013 | Street |
| 2013/0181556 A1 | 7/2013 | Li et al. |
| 2013/0298583 A1 * | 11/2013 | O'Donnell ............. B60H 1/323 |
| | | 62/115 |
| 2013/0319630 A1 | 12/2013 | Yamamoto |
| 2014/0066572 A1 | 3/2014 | Corveleyn |
| 2014/0075970 A1 | 3/2014 | Benson |
| 2014/0075973 A1 | 3/2014 | Graaf et al. |
| 2014/0102679 A1 | 4/2014 | Matsudaira et al. |
| 2014/0223939 A1 | 8/2014 | Nasuta et al. |
| 2014/0241926 A1 | 8/2014 | Fraser |
| 2014/0260358 A1 | 9/2014 | Leete et al. |
| 2014/0260403 A1 | 9/2014 | Connell |
| 2014/0290299 A1 | 10/2014 | Nakaya |
| 2014/0291411 A1 | 10/2014 | Tamaki et al. |
| 2015/0059367 A1 | 3/2015 | Emo et al. |

(56) References Cited

U.S. PATENT DOCUMENTS

| | | |
|---|---|---|
| 2015/0064639 A1 | 3/2015 | Dumbreck |
| 2015/0158368 A1 | 6/2015 | Herr-Rathke et al. |
| 2015/0202986 A1* | 7/2015 | Hatakeyama ............ F25B 5/02 |
| | | 165/287 |
| 2015/0210287 A1 | 7/2015 | Penilla et al. |
| 2015/0236525 A1 | 8/2015 | Aridome |
| 2015/0239365 A1 | 8/2015 | Hyde et al. |
| 2015/0306937 A1 | 10/2015 | Kitamura et al. |
| 2015/0330675 A1 | 11/2015 | Tamaki et al. |
| 2016/0089958 A1 | 3/2016 | Powell |
| 2016/0144685 A1 | 5/2016 | Ochiai et al. |
| 2016/0146554 A1 | 5/2016 | Bhatia et al. |
| 2016/0159199 A1 | 6/2016 | Kuroda et al. |
| 2016/0229266 A1 | 8/2016 | Maeda et al. |
| 2017/0211829 A1 | 7/2017 | Slack et al. |
| 2017/0211855 A1 | 7/2017 | Fraser et al. |
| 2017/0350632 A1 | 12/2017 | Hirao |

FOREIGN PATENT DOCUMENTS

| | | |
|---|---|---|
| CN | 201872573 U | 6/2011 |
| CN | 102196931 A | 9/2011 |
| CN | 102398496 A | 4/2012 |
| CN | 103547466 A | 1/2014 |
| CN | 104105610 A | 10/2014 |
| CN | 105071563 A | 11/2015 |
| CN | 105186726 A | 11/2015 |
| CN | 205177980 U | 4/2016 |
| CN | 205194809 U | 4/2016 |
| CN | 105576321 A | 5/2016 |
| CN | 105960345 A | 9/2016 |
| CN | 106103165 A | 11/2016 |
| CN | 106898841 A | 6/2017 |
| DE | 4440044 A1 | 5/1996 |
| DE | 197 45 028 A1 | 4/1999 |
| DE | 10014483 A1 | 11/2000 |
| DE | 199 42 029 A | 3/2001 |
| DE | 199 54 308 A1 | 7/2001 |
| DE | 102005004950 A1 | 8/2006 |
| DE | 10 2007 028851 A1 | 12/2008 |
| DE | 102010054965 A1 | 6/2012 |
| DE | 10 2012 022564 A1 | 5/2014 |
| DE | 11 2015 000552 | 11/2016 |
| EP | 0516413 A1 | 12/1992 |
| EP | 0958952 A1 | 11/1999 |
| EP | 1024038 A2 | 8/2000 |
| EP | 1 400 764 A1 | 3/2004 |
| EP | 1 477 748 A1 | 11/2004 |
| EP | 1 700 725 A1 | 9/2006 |
| EP | 1 703 231 A1 | 9/2006 |
| EP | 1 970 651 A1 | 9/2008 |
| EP | 2048011 A1 | 4/2009 |
| EP | 2196748 A2 | 6/2010 |
| EP | 2320160 A1 | 5/2011 |
| EP | 2894420 A1 | 7/2015 |
| EP | 0963895 A2 | 12/2015 |
| EP | 3118035 A1 | 1/2017 |
| FR | 2966391 A1 | 4/2012 |
| JP | H02-128915 A | 5/1990 |
| JP | 5032121 A | 2/1993 |
| JP | H07186711 A | 7/1995 |
| JP | H97-76740 A | 3/1997 |
| JP | H09318177 A | 12/1997 |
| JP | H10281595 A | 10/1998 |
| JP | 2000108651 A | 4/2000 |
| JP | 2005044551 A | 4/2000 |
| JP | 2002081823 A | 3/2002 |
| JP | 2005-033941 A | 2/2005 |
| JP | 2005-081960 A | 3/2005 |
| JP | 2006-264568 A | 10/2006 |
| JP | 2008220043 A | 9/2008 |
| JP | 2012017029 A | 1/2012 |
| JP | 2014226979 A | 12/2014 |
| KR | 20090068136 A | 6/2009 |
| WO | WO 89/09143 A1 | 10/1989 |
| WO | WO 99/61269 | 12/1999 |
| WO | WO 00/00361 | 1/2000 |
| WO | WO 2004/011288 A1 | 2/2004 |
| WO | WO 2006/082082 A1 | 8/2006 |
| WO | WO 2012/158326 A1 | 11/2012 |
| WO | WO 2013/113308 A1 | 8/2013 |
| WO | WO 2014/112320 A1 | 7/2014 |
| WO | WO 2014/180749 A1 | 11/2014 |
| WO | WO 2014/209780 A1 | 12/2014 |
| WO | WO 2015/076872 A1 | 5/2015 |

OTHER PUBLICATIONS

Anonymous: "NITE Connected Climate Controlled Transport Monitoring/Mobile Internet of Things UI Design/Mobil UI: Progress/Printeres/Internet of Things, User Inter . . . ," Oct. 19, 2016 retrieved from: URL:https://za.pinterest.com/pin/192810427773981541/, 1 pg.
Bergstrom, Inc., International Search Report and Written Opinion, PCT/US2014/026687, dated Jul. 28, 2014, 12 pgs.
Bergstrom, Inc., International Preliminary Report on Patentability, PCT/US2014/026687, dated Sep. 15, 2015, 7 pgs.
Bergstrom, Inc., International Search Report and Written Opinion, PCT/US2014/026683, dated Jul. 3, 2014 12 pgs.
Bergstrom, Inc., International Preliminary Report on Patentability, PCT/US2014/026683, dated Sep. 15, 2015, 6 pgs.
Bergstrom, Inc., International Search Report and Written Opinion, PCT/US2013/068331, dated Nov. 7, 2014, 9 pgs.
Bergstrom, Inc., International Preliminary Report on Patentability, PCT/US2013/068331, dated May 10, 2016, 6 pgs.
Bergstrom, Inc., International Search Report and Written Opinion, PCT/US2016/021602, dated Nov. 3, 2016, 7 pgs.
Bergstrom, Inc., International Preliminary Report on Patentability, PCT/US2016/021602, dated Sep. 12, 2017 , 11 pgs.
Bergstrom, Inc., International Search Report and Written Opinion, PCT/US2017/021346, dated Jul. 25, 2017, 11 pgs.
Bergstrom, Inc., International Search Report and Written Opinion, PCT/US2016/065812, dated Mar. 22, 2017, 12 pgs.
Bergstrom, Inc., International Preliminary Report on Patentability, PCT/US2016/065812, dated Jun. 12, 2018, 8 pgs.
Bergstrom, Inc., International Search Report and Written Opinion, PCT/US2018/044093, dated Oct. 25, 2018, 13 pgs.
Bergstrom, Inc., International Search Report and Written Opinion, PCT/US2017049859, dated Nov. 12, 2017, 4 pgs.
Bergstrom, Inc., International Preliminary Report on Patentability, PCT/US2017049859, dated Mar. 5, 2019, 6 pgs.
Bergstrom, Inc., International Search Report and Written Opinion PCT/US2017053196, dated Sep. 3, 2018, 17 pgs.
Bergstrom, Inc., International Preliminary Report on Patentability, PCT/US2017053196, dated Apr. 2, 2019, 11 pgs.
Bergstrom, Inc., International Search Report and Written Opinion PCT/US2016/423326, dated Sep. 27, 2016, 8 pgs.
Bergstrom, Inc., International Preliminary Report on Patentability PCT/US2016/423326, dated Jan. 16, 2018, 7 pgs.
Bergstrom, Inc., International Search Report and Written Opinion PCT/US2016/42307, dated Oct. 7, 2016, 8 pgs.
Bergstrom, Inc., International Preliminary Report on Patentability PCT/US2016/42307, dated Jan. 16, 2018, 7 pgs.
Bergstrom, Inc., International Search Report and Written Opinion PCT/US2016/42314, dated Sep. 30, 2016, 7 pgs.
Bergstrom, Inc., International Preliminary Report on Patentability, PCT/US2016/42314, dated Jan. 16, 2018, 6 pgs.
Bergstrom, Inc., International Search Report and Written Opinion PCT/US2016/42329, dated Sep. 30, 2016, 6 pgs.
Bergstrom, Inc., International Preliminary Report on Patentability PCT/US2016/42329, dated Jan. 16, 2018, 5 pgs.
Bergstrom, Inc., Communication Pursuant to Rules 161(2) and 162 EPC, EP14717604.4, dated Oct. 23, 2015, 2 pgs.
Bergstrom, Inc., Communication Pursuant to Article 94(3), EP14717604.4, dated Jun. 2, 2017, 12 pgs.
Bergstrom, Inc., Communication Pursuant to Article 94(3), EP14717604.4, dated Feb. 4, 2019, 5 pgs.

(56) References Cited

OTHER PUBLICATIONS

Bergstrom, Inc., Communication Pursuant to Rules 161(2) and 162 EPC, EP14722438.0, dated Nov. 2, 2015. 2 pgs.
Bergstrom, Inc. Communication Pursuant to Article 94(3), EP14722438.0, dated Jan. 24, 2018, 5 pgs.
Bergstrom, Inc., Communication Pursuant to Rules 161(2) and 162 EPC, EP13795064.8, dated Jun. 22, 2016, 2 pgs.
Bergstrom, Inc. Extended European Search Report, EP16204254.3, dated Jul. 25, 2017, 8 pgs.
Bergstrom, Inc. Partial European Search Report, EP16204259.2, dated May 30, 2017, 14 pgs.
Bergstrom, Inc. Extended European Search Report, EP16204259.2, dated Oct. 25, 2017, 15 pgs.
Bergstrom, Inc. Corrected Extended European Search Report, EP16204259.2, dated Nov. 24, 2017, 15 pgs.
Bergstrom, Inc. Partial European Search Report, EP16204256.8, dated Jul. 13, 2017, 14 pgs.
Bergstrom, Inc. Extended European Search Report, EP16204256.8, dated Jan. 12, 2018, 11 pgs.
Bergstrom, Inc. Extended European Search Report, EP16204256.8, dated Dec. 1, 2017, 13 pgs.
Bergstrom, Inc. Extended European Search Report, EP16204267.5, dated Jul. 11, 2017, 8 pgs.
Bergstrom, Inc., Communicaton Pursuant to Article 94(3), EP16820096.2, dated Aug. 12, 2019, 7 pgs.
Bergstrom, Inc. Extended European Search Report, EP18177850.7, dated Nov. 28, 2018. 8 pgs.
Bergstrom, Inc., Communication Pursuant to Rules 161(1) and 162, EP17780954.8, dated May 10, 2019, 3 pgs.
Bergstrom, Inc., Extended European Search Report, EP19166779.9, dated Aug. 30, 2019, 8 pgs.
Bergstrom, Inc., Office Action, CN201480027137.4, dated Mar 3, 2017, 15 pgs.
Bergstrom, Inc., 2nd Office Action, CN201480027137.4, dated Jul. 13, 2017, 10 pgs.
Bergstrom, Inc., 3rd Office Action, CN201480027137.4, dated Jan. 17, 2018, 19 pgs.
Bergstrom, Inc., 4th Office Action, CN201480027137.4, dated Jul. 26, 2018, 8 pgs.
Bergstrom, Inc., Notification of Grant, CN201480027137.4, dated Feb. 21, 2019, 1 pg.
Bergstrom, Inc., Patent Certificate CN201480027137.4, May 31, 2019, 4 pgs.
Bergstrom, Inc., Office Action, CN201480027117.7, dated Mar. 9, 2017, 8 pgs.
Bergstrom, Inc., Patent Certificate, CN201480027117.7, Nov. 21, 2017, 3 pgs.
Bergstrom, Inc., 2nd Office Action, CN201380081940.1, dated Jan. 17, 2018, 13 pgs.
Bergstrom, Inc., 3rd Office Action, CN201380081940.1, dated Jul. 31, 2018, 7 pgs.
Bergstrom, Inc., 1st Office Action, CN201680002224.3, dated Dec. 11, 2018, 5 pgs.
Bergstrom, Inc., Letters Patent, CN201680002224.3, Sep. 10, 2019, 2 pgs.
Connell, Office Action, U.S. Appl. No. 14/209,877, dated Nov. 27, 2015, 19 pgs.
Connell, Final Office Action, U.S. Appl. No. 14/209,877, dated Jun. 22, 2016, 17 pgs.
Connell, Office Action, U.S. Appl. No. 14/209,877, dated Dec. 29, 2016, 21 pgs.
Connell, Notice of Allowance, U.S. Appl. No. 14/209,877, dated May 16, 2017, 5 pgs.
Connell, Notice of Allowance, U.S. Appl. No. 14/209,877, dated Aug. 4, 2017, 7 pgs.
Connell, Office Action, U.S. Appl. No. 14/209,961, dated Dec. 2, 2015, 14 pgs.
Connell, Final Office Action, U.S. Appl. No. 14/209,961, dated Jul. 25, 2016, 15 pgs.
Connell, Notice of Allowance, U.S. Appl. No. 14/209,961, dated Jun. 15, 2017, 10 pgs.
Connell, Notice of Allowance, U.S. Appl. No. 15/064,552, dated Jun. 1, 2017, 9 pgs.
Connell, Notice of Allowance, U.S. Appl. No. 14/995,119, dated Aug. 31, 2017, 7 pgs.
Connell, Office Action, U.S. Appl. No. 14/965,142, dated Aug. 29, 2017, 12 pgs.
Connell, Notice of Allowance, U.S. Appl. No. 14/965,142, dated Feb. 26, 2018, 8 pgs.
Connell, Office Action, U.S. Appl. No. 15/280,876, dated Dec. 14, 2017, 23 pgs.
Connell, Notice of Allowance, U.S. Appl. No. 15/280,876, dated Jun. 21, 2018, 9 pgs.
Connell, Office Action, U.S. Appl. No. 15/791,243, dated May 8, 2018, 12 pgs.
Connell, Office Action, U.S. Appl. No. 15/065,745, dated May 31, 2018, 44 pgs.
Connell, Final Office Action, U.S. Appl. No. 15/065,745, dated Dec. 17, 2018, 27 pgs.
Connell, Office Action, U.S. Appl. No. 15/065,745, dated May 9, 2019, 28 pgs.
Connell, Notice of Allowance, U.S. Appl. No. 15/065,745, dated Nov. 14, 2019, 9 pgs.
Connell, Office Action, U.S. Appl. No. 15/283,150, dated Sep. 27, 2018, 21pgs.
Connell, Notice of Allowance, U.S. Appl. No. 15/283,150, dated Mar. 22, 2019, 8 pgs.
Connell, Office Action, dated Oct. 19, 2018, U.S. Appl. No. 15/722,860, 7 pgs.
Connell, Notice of Allowance, dated Feb. 7, 2019, U.S. Appl. No. 15/722,860, 5 pgs.
Connell, Notice of Allowance, dated May 20, 2019, U.S. Appl. No. 15/722,860, 5 pgs.
Connell, Notice of Allowance, U.S. Appl. No. 15/791,243, dated Jan. 24, 2019, 7 pgs.
Connell, Notice of Allowance, U.S. Appl. No. 15/791,243, dated May 15, 2019, 7 pgs.
Connell, Office Action, dated Apr. 18, 2019, U.S. Appl. No. 15/816,993, 17 pgs.
Connell, Notice of Allowance, dated Sep. 26, 2019, U.S. Appl. No. 15/816,993, 8 pgs.
Connell, Office Action, U.S. Appl. No. 15/439,865, dated Sep. 24, 2019, 6 pgs.
Connell, Office Action, U.S. Appl. No. 15/660,734, dated Oct. 30, 2019, 24 pgs.
Connell, Office Action, U.S. Appl. No. 16/941,495, dated Feb. 1, 2022, 12 pgs.
Connell, Notice of Allowance, U.S. Appl. No. 16/941,495, dated Jul. 5, 2022, 8 pgs.
Connell, Office Action, U.S. Appl. No. 17/560,216, dated Nov. 21, 2022, 10 pgs.
Connell, Notice of Allowance, U.S. Appl. No. 17/560,216, dated Mar. 9, 2023, 8 pgs.
Connell, Office Action, U.S. Appl. No. 17/224,052, dated Feb. 6, 2023, 8 pgs.
Connell, Notice of Allowance, U.S. Appl. No. 16/922,855, dated Jun. 20, 2022, 8 pgs.
FlatPlate Heat Exchangers; GEA FlatPiate Inc.; website—http://www.flatplate.com/profile.html; date last visited Aug. 9, 2007; 3 pages.
Glacier Bay Inc., Glacier Bay's Home Page, page printed from a website, htt(?:i/web.archive.org/web/19990417062255/htt[2://www.glacierbay.com/, apparent archive date: Apr. 17, 1999, 1 page.
Glacier Bay Inc., Darpa/Glacier Bay ECS, pages printed from a website, httir/web.archive.org/web/19991104132941/wvvw.glacierbay.com/darQatxt. htm, apparent archive date: Nov. 4, 1999, 2 pages.
Glacier Bay Inc., Glacier Bay ECS DARPA Project-Final Report, pages printed from a website, httn://web.archive.or_gjweb/19991103001512/v•vww,_g.Jacierbay.com/Darnhtm.htm, apparent archive date: Nov. 3, 1999, 9 pages.

(56) References Cited

OTHER PUBLICATIONS

Glacier Bay Inc., Glacier Bay ECS DARPA Project-Project Photos, pages printed from a website, http://web.archive.org/web/19991103012854/www.glacierbay.com/Dargghotos.htm, apparent archive date: Nov. 3, 1999, 2 pages.

Glacier Bay Inc., Glacier Bay ECS DARPA Project-Operational Video, page printed from a website, httQ://web.archive.org/web/19991022221040/wvvw.glacierbay.com/DarQvid.htm, apparent archive date Oct. 22, 1999; 1 page.

Glacier Bay Inc., R & D, pages printed from a website, htt://web.archive.org/web/20000121130306/www.glacierbay.com/R&D.htm, apparent archive date: Jan. 21, 2000, 2 pages.

Glacier Bay Inc., Company History, pages printed from a website, http://web.archive.org/web/20000301153828/www.glacierbay.corn/History:.htrn, apparent archive date: Mar. 1, 2000; 2 pages.

Glacier Bay Inc., Contact, page printed from a website, httQ://web.archive.org/web/19990508104511/W\'I!V.qlacierba:t.com/Contact.htm, apparent archive date: May 8, 1999; 1 page.

Hansson, Office Action dated Oct. 5, 2018, U.S. Appl. No. 15/256,109, 14pgs.

Hansson, Final Office Action, U.S. Appl. No. 15/256,109, dated May 2, 2019, 14 pgs.

Hansson, Notice of Allowance, U.S. Appl. No. 15/256,109, dated Sep. 24, 2019, 9 pgs.

Michael Löhle, Günther Feuerecker and Ulrich Salzer; Non Idling HVAC-modufe tor Long Distance Trucks;SAE TechnicalPaper Series 1999-01-1193; International Congress and Exposition, Detroit, Michigan; Mar. 1-4, 1999; 8 pages.

Mahmoud Ghodbane; On Vehicle Performance of a Secondary Loop A/C System; SAE Technical Paper Series 2000-01-1270; SAE 2000 World Congress, Detroit, Michigan; March Jun. 9, 2000; 6 pages.

Masami Konaka and Hiroki Matsuo; SAE Technical Paper Series 2000-01-1271; SAE 2000 World Congress, Detroit, Michigan; Mar. 6-9, 2000; 6 pages.

Mayo Mayo, Office Action, U.S. Appl. No. 15/034,517, dated Feb. 21, 2018, 22 pgs.

Mayo Mayo, Final Office Action, U.S. Appl. No. 15/034,517, dated Aug. 28, 2018, 9pgs.

Mayo Mayo, Final Office Action, U.S. Appl. No. 15/034,517, dated Nov. 30, 2018, 7 pgs.

Frank Stodolsky, Linda Gaines, and Anant Vyas; Analysis of Technology Options to Reduce the Fuel Consumption of Idling Trucks; Paper-Center for Transportation Research, Energy Systems Division, Argonne National Laboratory,9700 South Cass Avenue, Argonne, Illinois 60439;Jun. 2000; 30 pages.

Paper No. 26 in IPR2012-00027, Jun. 11, 2013, 12 pgs. (U.S. Pat. No. 7,591,303).

Patricia Gardie and Vincent Goetz; Thermal Energy Storage System by Solid Absorption for Electric Automobile Heating and Air-Conditioning; Paper; 5 pages.

TropiCool No-idle Heating & Cooling, 110V/12V High-efficiency, Self-contained, Electrified Heating/AC System; ACC Climate Control Brochure, Elkhart, Indiana; 205, 1 page.

TropiCool Power Plus, More comfort. More efficiency. More options.; ACC Climate Control Brochure, Elkhart, Indiana; 2006, 3 pages.

TYCO Electronics Corporation, "MAG-MATE Connector with Multispring Pin," Datasheet, 2013, pp. 1-2 from <URL: http://datasheet.octopart.com/1247003-2-TE-Connectivity-datasheet-14918754.pdf>.

Packless Industries, the leader in refrigerant to water coaxial heat exchangers, flexible hoses and sucti . . . ; website—http://www.packless.com/profile.htmle: date last visited Aug. 9, 2007; 1 page.

Zeigler, Office Action, U.S. Appl. No. 13/661,519, dated Mar. 11, 2013, 8 pgs.

Zeigler, Final Office Action, U.S. Appl. No. 13/661,519, dated Sep. 18, 2013, 15 pgs.

Zeigler, Office Action, U.S. Appl. No. 13/661,519, dated Apr. 9, 2014, 20 pgs.

Zeigler, Final Office Action, U.S. Appl. No. 13/661,519, dated Sep. 26, 2014, 23 pgs.

Zeigler, Office Action, U.S. Appl. No. 13/661,519, dated Oct. 28, 2015, 20 pgs.

Zeigler, Notice of Allowance, U.S. Appl. No. 13/661,519, dated Jun. 17, 2016, 8 pgs.

Zeigler, Office Action, U.S. Appl. No. 16/046,711, dated Feb. 6, 2020, 17 pgs.

Zeigler, Final Office Action, U.S. Appl. No. 16/046,711, dated Jul. 23, 2020, 17 pgs.

Zeigler, Advisory Action, U.S. Appl. No. 16/046,711, dated Oct. 27, 2020, 5 pgs.

Zeigler, Office Action, U.S. Appl. No. 16/046,711, dated Aug. 31, 2021, 16 pgs.

Connell, Notice of Allowance, U.S. Appl. No. 17/224,052, Jun. 2, 2023, 5 pgs.

Connell, Office Action, U.S. Appl. No. 18/071,517, Jul. 7, 2023, 18 pgs.

Xei, Office Action, U.S. Appl. No. 17/894,106, Jun. 23, 2023, 10 pgs.

Xei, Office Action, U.S. Appl. No. 17/894,106, Nov. 8, 2023, 7 pgs.

Bergstrom, Inc., Communication Pursuant to Article 94(3), EP18177850.7, Jan. 30, 2023, 4 pgs.

Bergstrom, Inc., First Office Action, CN201880062566.3, Feb. 9, 2021, 15 pgs.

Bergstrom, Inc., Second Office Action, CN201880062566.3, Oct. 19, 2021, 13 pgs.

\* cited by examiner

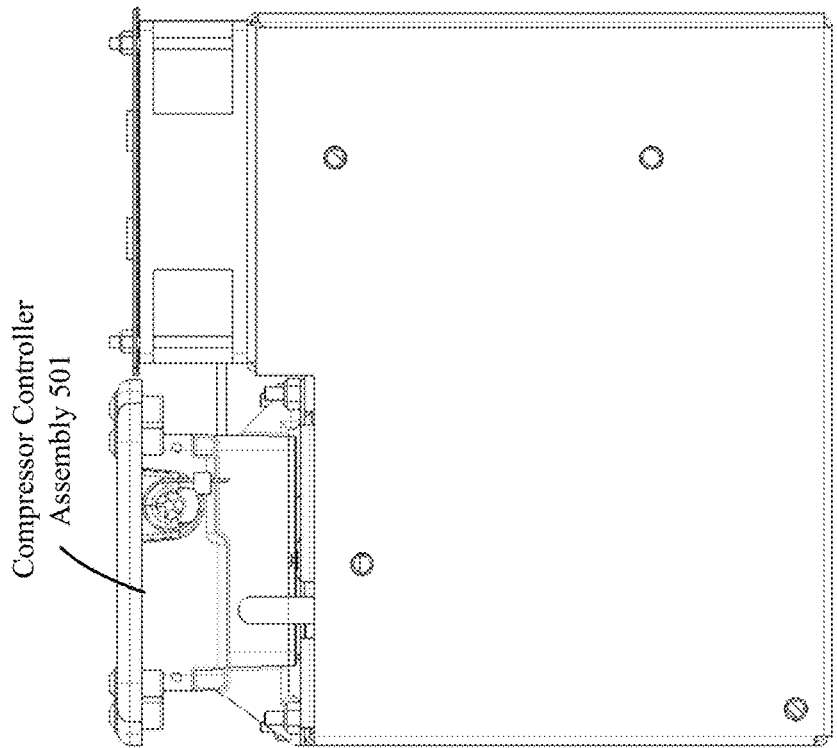
Figure 5H (Bottom View)
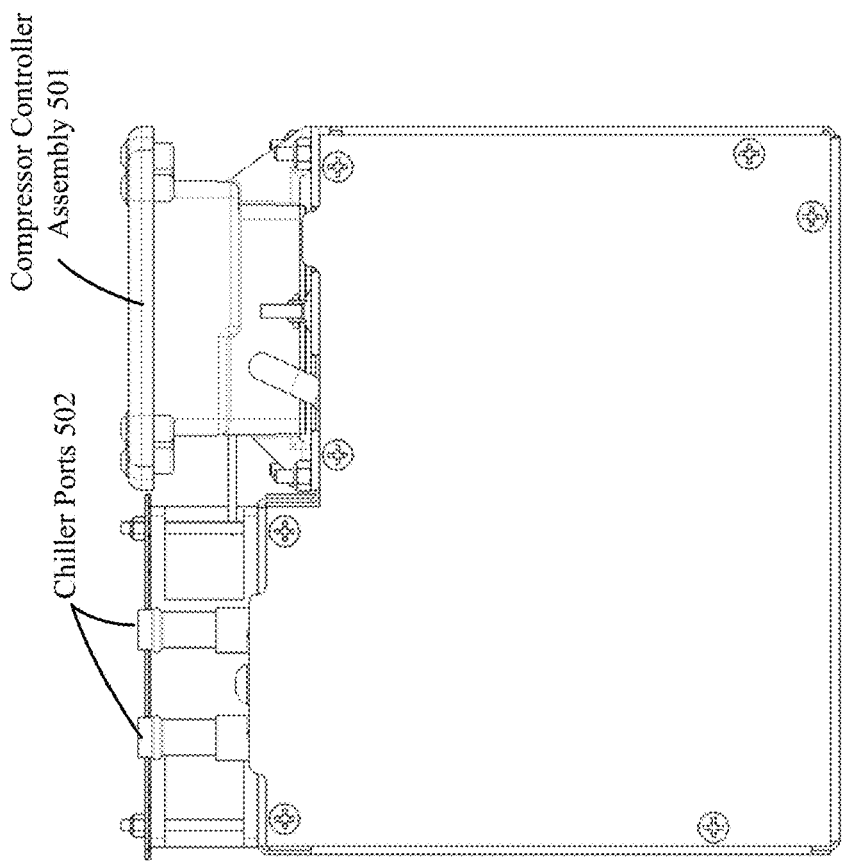
Figure 5G (Top View)

(Side View)

(Front View)

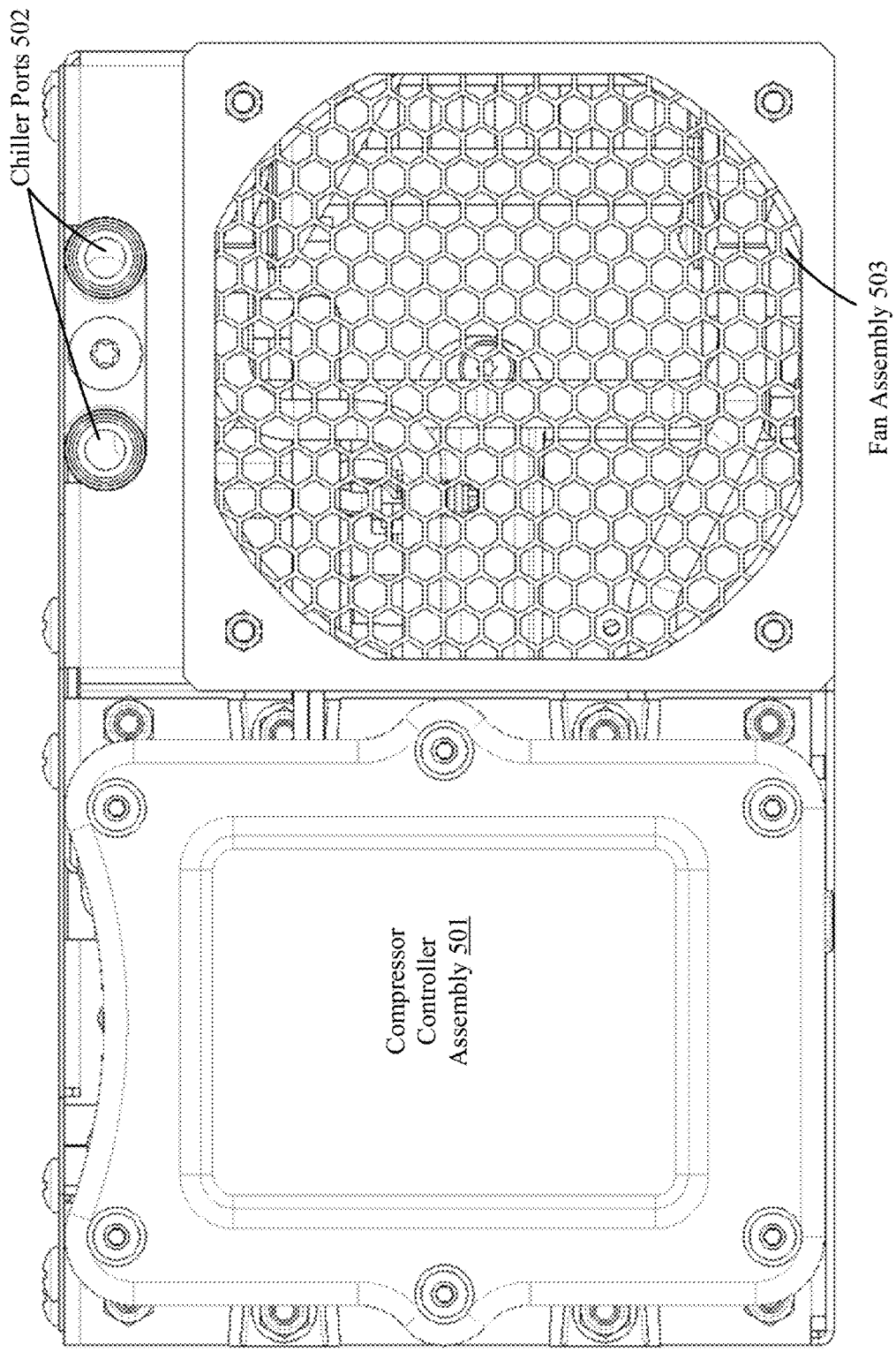
Figure 5K (Back View)

REFRIGERANT SYSTEM FOR COOLING ELECTRONICS

PRIORITY AND RELATED APPLICATIONS

This application is a continuation of U.S. patent application Ser. No. 16/046,711, filed Jul. 26, 2018, entitled "Refrigerant System for Cooling Electronics," which claims priority to U.S. Provisional Patent Application No. 62/537,864, filed Jul. 27, 2017, entitled "Refrigerant System for Cooling Electronics," which are hereby incorporated by reference in their entirety.

This application is related to U.S. patent application Ser. No. 15/283,150, filed Sep. 30, 2016, entitled "Refrigerant Liquid-gas Separator with Electronics Cooling," which is hereby incorporated by reference in its entirety.

TECHNICAL FIELD

This relates generally to vehicular refrigerant systems, including but not limited to, vehicular refrigerant systems for cooling electronics.

BACKGROUND

Electronic systems are susceptible to failure and damage in high heat conditions. Operation of such electronic systems may generate a significant amount of heat. This problem may be exacerbated on vehicular electronic systems, where the vehicle produces its own heat and may be operated in high heat regions. Thus, it is important to keep the electronic systems cooled to a safe operating temperature.

Some existing electronic systems utilizing liquid cooling to dissipate the heat. However, such passive cooling is insufficient to keep the electronic systems cooled to a safe operating temperature in some circumstances.

SUMMARY

Accordingly, there is a need for systems and/or devices with more efficient and accurate methods for cooling electronics. In some instances, such systems, devices, and methods prevent failure of the electronics, resulting in decreased repair times and/or costs. Such systems, devices, and methods optionally complement or replace conventional systems, devices, and methods for cooling electronics.

Some implementations include a method for cooling an electronics system, the method including: (1) cooling the electronics system by operating a vehicular refrigerant system in a first state, the vehicular refrigerant system including a condenser, a compressor, and an expansion device; (2) while operating the refrigerant system in the first state, obtaining sensor information from one or more sensors of the refrigerant system; and (3) transitioning to operating the vehicular refrigerant system in a second state based on the sensor information In some implementations, transitioning to operating in the second state includes adjusting a compressor speed. In some implementations, transitioning to operating in the second state includes adjusting a condenser fan speed. In some implementations, transitioning to operating in the second state includes adjusting a liquid pump speed.

In some implementations, the sensor information includes information regarding a temperature of the electronics system. In some implementations, the sensor information includes information regarding a temperature of a refrigerant in the refrigerant system. In some implementations, the sensor information includes information regarding a pressure of refrigerant in the refrigerant system.

In some implementations: (1) the sensor information indicates that the electronics system does not require active cooling; and (2) operating in the second state includes disabling at least a portion of the refrigerant system.

In another aspect, some implementations include a vehicular refrigerant system having: (1) a refrigerant loop, including: (a) a compressor configured to compress a refrigerant; (b) a condenser configured to condense the compressed refrigerant; (c) an expansion device configured to enable expansion of the condensed refrigerant; and (d) a heat exchanger configured to transfer heat from a liquid coolant to the expanded refrigerant; (2) a liquid coolant loop configured to transfer heat from an electronics system via the liquid coolant, the liquid coolant loop including a liquid pump configured to pump the liquid coolant through the liquid coolant loop; and (3) a controller communicatively coupled to the refrigerant loop and the liquid coolant loop, the controller configured to: (a) obtain operating data regarding the refrigerant, the liquid coolant, and/or the electronics system; and (b) adjust operation of the refrigerant loop and/or the liquid coolant loop based on the obtained operating data.

In some implementations, the operating data includes information regarding one or more of: a temperature of the electronics system, a temperature of the refrigerant, a pressure of the refrigerant, and a temperature of the liquid coolant.

In some implementations, adjusting operation of the refrigerant loop and/or the liquid coolant loop includes one or more of: adjusting a compressor compression ratio, adjusting a compressor speed, adjusting a condenser fan speed, and adjusting a liquid coolant pump speed.

In yet another aspect, some implementations include a computing device including one or more processors and memory coupled to the one or more processors, the memory storing one or more programs configured to be executed by the one or more processors, the one or more programs including instructions for performing any of the methods described herein.

In yet another aspect, some implementations include a non-transitory computer-readable storage medium storing one or more programs for execution by one or more processors of a vehicle refrigerant system, the one or more programs including instructions for performing any of the methods described herein.

Thus, devices, storage mediums, and systems are provided with methods for cooling an electronics system, thereby increasing the effectiveness, efficiency, and user satisfaction with such systems. Such methods may complement or replace conventional methods for cooling an electronics system.

BRIEF DESCRIPTION OF THE DRAWINGS

For a better understanding of the various described implementations, reference should be made to the Detailed Description below, in conjunction with the following drawings in which like reference numerals refer to corresponding parts throughout the figures.

FIGS. 5A-5K are component drawings illustrating components of a representative refrigerant system in accordance with some implementations.

DETAILED DESCRIPTION

Reference will now be made in detail to implementations, examples of which are illustrated in the accompanying drawings. In the following detailed description, numerous specific details are set forth in order to provide a thorough understanding of the various described implementations. However, it will be apparent to one of ordinary skill in the art that the various described implementations may be practiced without these specific details. In other instances, well-known methods, procedures, components, circuits, and networks have not been described in detail so as not to unnecessarily obscure aspects of the implementations.

Many modifications and variations of this disclosure can be made without departing from its spirit and scope, as will be apparent to those skilled in the art. The specific implementations described herein are offered by way of example only, and the disclosure is to be limited only by the terms of the appended claims, along with the full scope of equivalents to which such claims are entitled.

Implementations of the present disclosure are described in the context of refrigerant systems for use in vehicles, and in particular, in the context of refrigerant systems to cool electronics (e.g., roof-mounted electronics) of an over-the-road or off-road vehicle. Roof-mounted electronics are typically exposed to direct sunlight for extend periods of time while the vehicle is travelling. The direct sunlight can further increase heating of the roof-mounted electronics, increasing the need for an electronics' refrigerant system (also sometimes called a refrigeration system or a cooling system). In some implementations, the refrigerant system is, or is a component of, a heating, ventilation, and air-conditioning (HVAC) system. In some implementations, the refrigerant system is not used to cool an interior of the vehicle (e.g., is distinct from a second refrigerant system used to cool an interior of the vehicle).

As used herein, a "refrigerant" is a fluid adapted to undergo phase transitions between liquid and gas during operation of a corresponding refrigerant system. For example, the refrigerant has a liquid-to-gas transition point below a target operating temperature of the refrigerant system. In various implementations, the refrigerant may be a class 1, class 2, or class 3 refrigerant.

Figure 1:
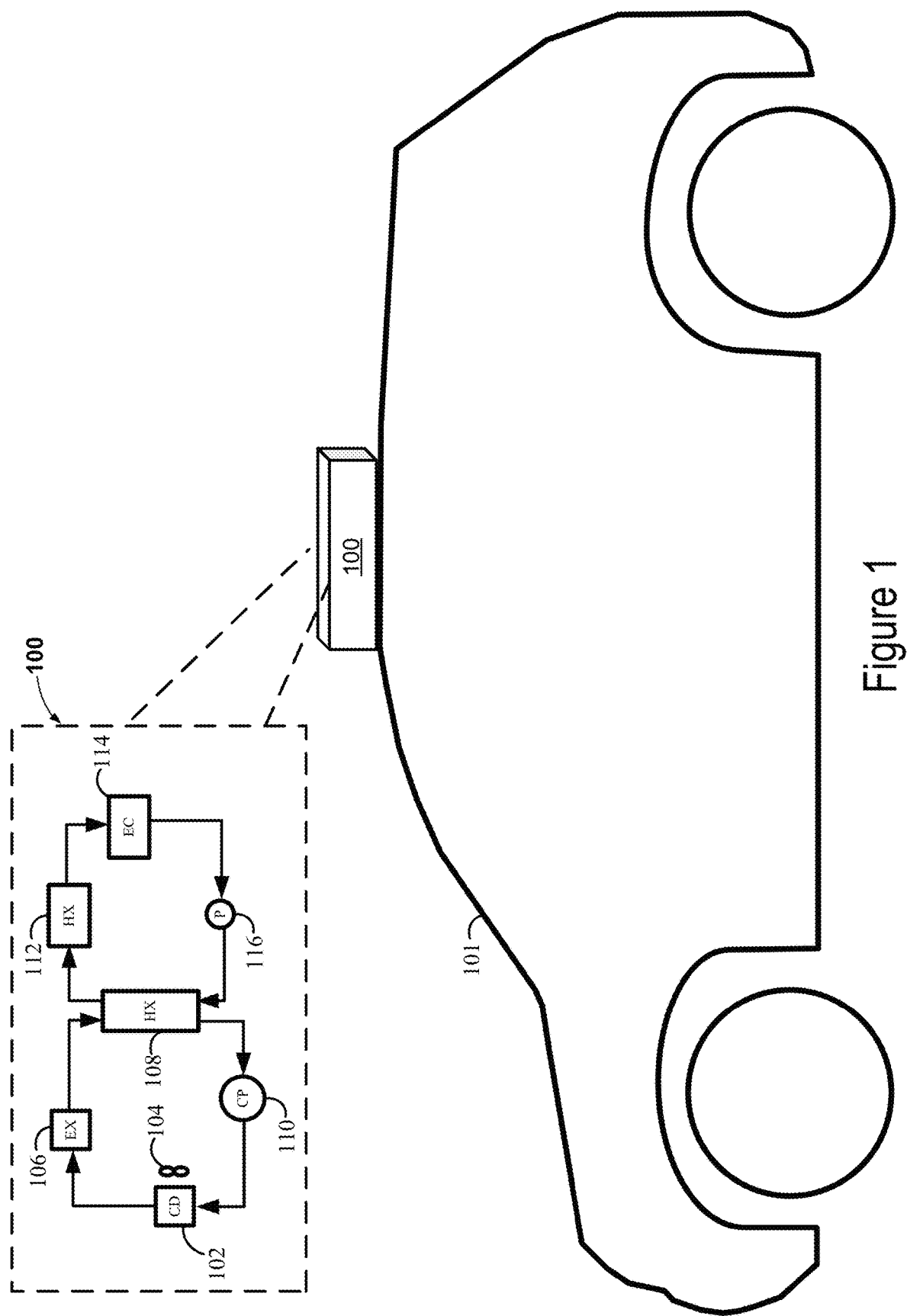
FIG. 1 is a block diagram illustrating a vehicular refrigerant system in accordance with some implementations.

FIG. 1 is a block diagram illustrating a vehicular refrigerant system 100 in accordance with some implementations. FIG. 1 shows a vehicle 101 with the refrigerant system 100. As shown in FIG. 1, the refrigerant system 100 has a refrigerant circuit including a compressor 110, a condenser 102, a condenser fan 104, an expansion device 106 (e.g., an evaporator or thermal expansion valve), a heat exchanger 108, and refrigerant lines fluidly connecting the compressor 110, condenser 102, expansion device 106, and the heat exchanger 108 to circulate a refrigerant. FIG. 1 further shows the refrigerant system 100 having a liquid coolant loop including a secondary heat exchanger 112 and a liquid coolant pump 116. As shown in FIG. 1, the heat exchanger 108 is configured to transfer heat between the liquid coolant and the refrigerant. In some implementations, the secondary heat exchanger 112 is configured to transfer heat between the liquid coolant and air. The liquid coolant loop is configured to provide the liquid coolant to the electronic component 114.

It is to be appreciated that the term vehicle as used herein may refer to trucks, such as tractor-trailer trucks or semi-trailer trucks, the scope of the present teachings is not so limited. The present teachings are also applicable, without limitation, to cars, vans, buses, trailers, boats, trains, planes, and any other suitable vehicle.

In some implementations, the refrigerant system includes at least one user interface (e.g., touch screen) and at least one sensor (e.g., a thermostat). In some implementations, the refrigerant system includes at least one battery or power source and a battery monitoring system (also sometimes called a battery management system). In some implementations, the battery monitoring system includes at least one current sensor. In some implementations, the battery monitoring system includes a controller, such as an automatic temperature controller. In some implementations, the controller is electrically coupled to other components of the refrigerant system (e.g., a compressor, a condenser, etc.) to control operation of these components.

In some implementations, the refrigerant loop includes a receiver drier unit (not shown) and/or an accumulator unit (not shown). As used herein, the term "downstream" refers to a position along a refrigerant line in the direction of the refrigerant flow. As used herein, the term "upstream" refers to a position along a refrigerant line opposite to the direction of the refrigerant flow. For example, in FIG. 1 the condenser 102 is disposed downstream of the compressor 110 and fluidly connected to the compressor 110 by a refrigerant line. In some implementations, a receiver drier unit is disposed downstream of the condenser 102 and fluidly connected to the condenser 102 by a refrigerant line. In some implementations, the receiver drier unit includes a receiver drier and a first sensor. In some implementations, the expansion device 106 is disposed downstream of the receiver drier unit and fluidly connected to the receiver drier unit by a refrigerant line. In some implementations, the accumulator unit is disposed downstream of the expansion device 106 and fluidly connected to the expansion device 106 by a refrigerant line and to the compressor 110 by a refrigerant line. In some implementations, the accumulator unit includes an accumulator and a second sensor.

In some implementations, the refrigerant loop includes one or more sensors. In some implementations, the sensor(s) are any type of sensor suitable to measure temperature and/or pressure of the refrigerant, including but not limited to combined pressure and temperature transducers.

In some implementations, during operation of the refrigerant system, the compressor 110 compresses a refrigerant into a compressed refrigerant. The compressor 110 is optionally any type of compressor including but not limited to a reciprocating compressor or rotary compressor. The condenser 102 condenses the refrigerant that has been compressed by the compressor 110. In some implementations, the receiver drier of the receiver drier unit temporarily stores the refrigerant and/or absorbs moisture, debris or other undesirable substances from the refrigerant that has been condensed by the condenser 102. In some implementations, a first sensor measures temperature and pressure of the refrigerant that has been condensed by the condenser 102. The expansion device 106 vaporizes or evaporates the refrigerant that has been condensed by the condenser 102, providing cooling for desired use. In some implementations, the accumulator restricts liquid refrigerant from entering the compressor 110, for example by temporarily storing excess liquid refrigerant at the accumulator, to prevent damage to the compressor 110. In some implementations, a second sensor measures temperature and pressure of the refrigerant that has been vaporized/evaporated by the expansion device 106. It should be noted that depending on the operation and performance of the refrigerant system, the condensed refrigerant at the receiver drier and the vaporized/evaporated refrigerant at the accumulator is in the form of a liquid, a vapor, or a mixture of liquid and vapor.

In some implementations, the compressor 110 is a variable speed compressor. The variable speed compressor allows the system to operate at a lower capacity to conserve the energy (e.g., while the electronics 114 require little or no cooling).

Figure 2:
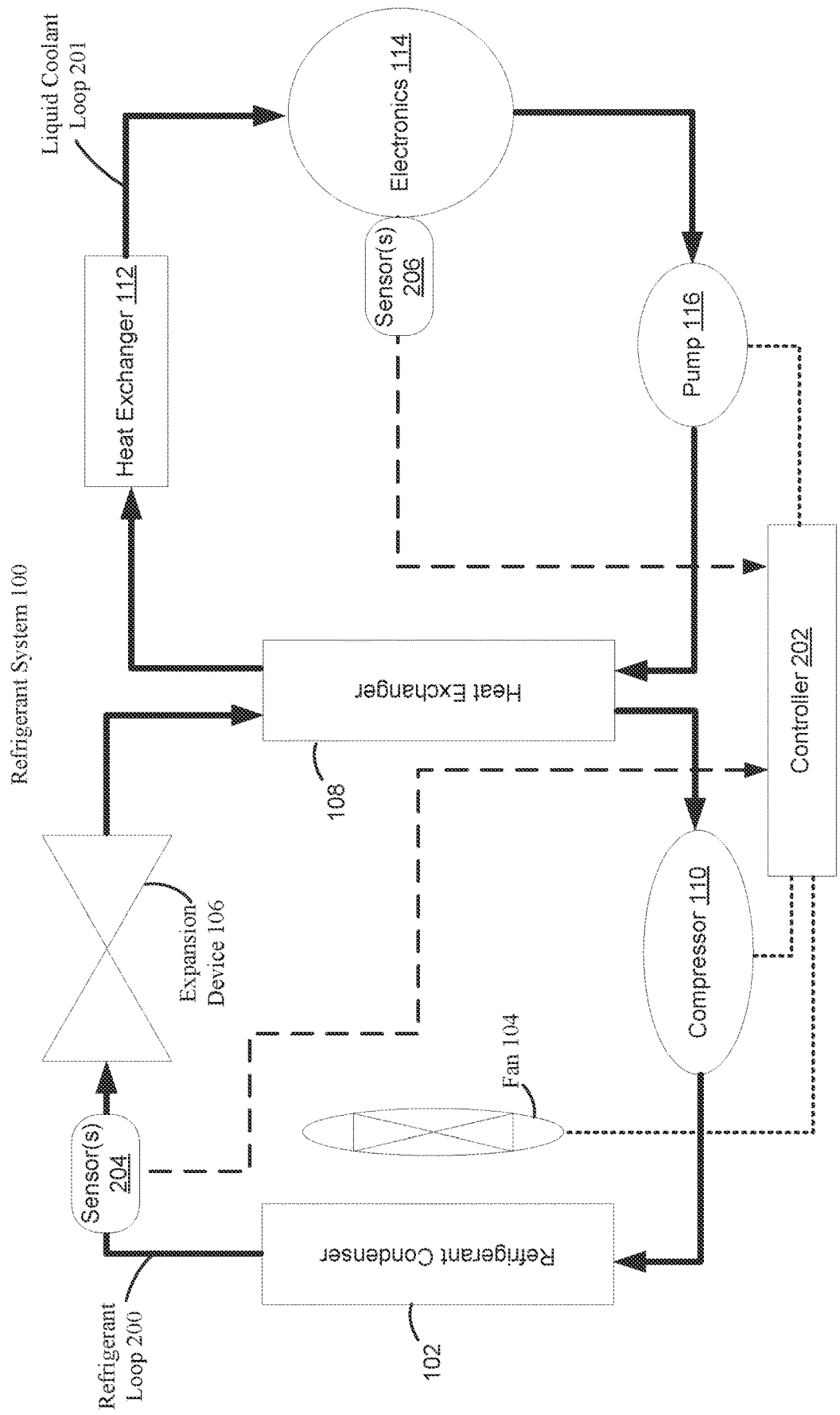
FIG. 2 is a block diagram illustrating a vehicular refrigerant system in accordance with some implementations.

FIG. 2 is a block diagram illustrating the refrigerant system 100 in accordance with some implementations. As shown in FIG. 2, the refrigerant system 100 includes a refrigerant loop 200 having the compressor 110 (e.g., an electrically-driven compressor), the condenser 102, the expansion device 106, and the heat exchanger 108 for exchanging heat with liquid coolant in the liquid coolant loop. The refrigerant loop 200 optionally includes one or more sensors, such as sensor(s) 204 for measuring a temperature and/or pressure of the refrigerant. In some implementations, the sensor(s) 204 are located at other positions along the refrigerant loop 200 (e.g., between the compressor 110 and the condenser 102 or between the heat exchanger 108 and the compressor 110). The refrigerant system 100 also includes a liquid coolant loop 201 for transferring heat from the electronics 114. The liquid coolant loop 201 includes a pump 116 for cycling liquid coolant through the liquid coolant loop, and, optionally, includes the second heat exchanger 112 for transferring heat between the liquid coolant and air (e.g., ambient air) and/or one or more sensors such as the sensor(s) 206 configured to monitor a temperature of the electronics. In some implementations, the liquid coolant loop 201 does not include the pump 116, e.g., the liquid coolant provides a substantially stationary interface between the heat exchanger 108 and the electronics 114.

In accordance with some implementations, the refrigerant loop 200 is arranged such that: an output of the refrigerant condenser 102 is fluidly connected to an input of the expansion device 106 via a first refrigerant connector (e.g., with sensor(s) 204 coupled to the first refrigerant connector); an output of the expansion device 106 is fluidly connected to the heat exchanger 108 via a second refrigerant connector; the heat exchanger 108 is fluidly connected to an input of the compressor 110 via a third refrigerant connector; and an output of the compressor 110 is connected to the refrigerant condenser 102 via a fourth refrigerant connector. The refrigerant connectors are optionally pipes (e.g., aluminum or copper pipes), tubes (e.g., rubber tubes), or the like. In some implementations, at least a first subset of the refrigerant connectors is composed of insulating material. In accordance with some implementations, the fan 104 is positioned to blow air across the refrigerant condenser 102.

In accordance with some implementations, the liquid coolant loop 201 is arranged such that: an output of the pump 116 is fluidly connected to the heat exchanger 108 via a first liquid coolant connector; the heat exchanger 108 is fluidly connected to the heat exchanger 112 via a second liquid coolant connector; and the heat exchanger 112 is fluidly connected to the pump 116 via a third liquid coolant connector (e.g., with the sensor(s) 206 and the electronics 114 coupled to the third liquid coolant connector). The liquid coolant connectors are optionally pipes (e.g., aluminum or copper pipes), tubes (e.g., rubber tubes), or the like. In some implementations, at least a first subset of the liquid coolant connectors is composed of insulating material. In some implementations, the electronics 114 are submerged in a cavity within the liquid coolant loop 201 (e.g., after being hermetically sealed), whereas in other implementations, the electronics 114 are thermally coupled to the liquid coolant (e.g., via a conducting fasteners, thermal paste, and the like).

The refrigerant system 100 also includes control circuitry, such as controller 202, for governing operation of the refrigerant system 100. In some implementations, the controller 202 receives operating data (e.g., temperature and/or pressure data) from the refrigerant loop 200, the liquid coolant loop 201, and/or the electronics 114. In some implementations, the controller 202 receives the data from one or more sensors of the refrigerant system 100 (e.g., the sensor(s) 204). In some implementations, the controller 202 receives data generated by the electronics 114 (e.g., operating temperature, processor load, latency information, and the like). In some implementations, the controller 202 controls operation of the fan 104, the compressor 110, and/or the liquid coolant pump 116. In some implementations, the controller 202 adjusts a speed of operation of the fan 104. In some implementations, the controller 202 adjusts a speed of operation of the pump 116. In some implementations, the controller 202 adjusts a compression ratio for the compressor 110.

In some implementations, the controller 202 is configured to calculate a compression ratio of the compressor 110. If the calculated compression ratio exceeds a specific compression ratio for a given condition, the controller determines that a blockage has occurred in the refrigerant circuit. In some implementations, the controller examines various factors to determine a location of the blockage. For example, an abnormal sub-cooling level indicates a blockage in the condenser 102 and an abnormal super-cooling indicates a blockage in the expansion device 106.

In some implementations, the controller 202 is configured to modulate the speed, and therefore the capacity, of the compressor 110. For example, the controller 202 may operate the compressor 110 at maximum compressor speed and capacity while the electronics are at a temperature above a particular threshold. As the electronics cool down, the controller 202 senses the reduction in temperature and reduces the compressor speed/capacity so as to not draw an excessive amount of power. The speed and capacity of the compressor may be increased as needs demand as determined by the controller 202.

The controller 202 monitors various system parameters to perform its governing functions. In some implementations, both the exterior ambient temperature and the electronics' 114 temperature are monitored by the controller to determine a compressor capacity to achieve and maintain the interior set point temperature. As the electronics' 114 temperature drops the controller 202 optionally reduces the compressor speed and capacity.

In some implementations, the controller 202 monitors (e.g., in addition to the system parameters described above) the compressor power consumption and/or the total system power consumption in its modulation of the compressor speed and capacity. The information obtained from monitoring the various system parameters and/or power consumption is used by the controller 202 to modulate operation of the compressor 110, e.g., to ensure that the available power sources are not depleted beyond a predetermined power capacity for those times that a limited power source is being utilized. For example, the controller 202 may reduce the compressor speed and capacity if the monitored power consumption exceeds appropriate levels. In some implementations, these parameters are also utilized to provide system protection from overload faults.

In some implementations, the controller 202 also monitors system parameters of the refrigerant system including the compressor speed and the refrigerant system pressures and temperatures. In some implementations, the compressor speed signal is utilized in the closed loop proportional, integral, derivative (PID) control. In some implementations, the refrigerant system pressures and/or temperatures are utilized as control parameters to regulate the compressor speed and capacity so that the power utilization is optimized. That is, the compressor modulation may be reduced once a target temperature has been reached within the system to adequately cool the electronics 114. In some implementations, the compressor is stopped altogether while the electronics 114 are below a particular temperature threshold and/or the liquid coolant is determined to be sufficient to cool the electronics without the exchange of heat with the refrigerant. Once the temperature of the electronics and/or the liquid coolant exceeds one or more predetermined thresholds, the controller 202 once again starts the compressor 110. In this way, the draw from the available power sources is minimized while still achieving the goal of providing adequate cooling to the electronics 114. In some implementations, the system parameters also provide the controller 202 with the ability to detect faults within the system (e.g., blockages, undesired refrigerant levels, and the like).

In some implementations, system information such as status display and control inputs are provided between the controller 202 and an operator via a user input/output display (e.g., a display within the vehicle). In some implementations, the controller 202 and a user display are coupled via a wired or wireless communication connection. In some such implementations, communication of control parameters from the user is optionally provided to the controller by means of a serial data link. Likewise, the display of system control and status information is optionally provided by the controller 202 to the display by this serial data link. Control parameters from the user optionally include the desired operating mode of the refrigerant system and/or a desired temperature of the electronics.

In some implementations, the controller 202 controls the speed of the condenser fan 104 and/or the pump 116, e.g., in conjunction with the speed of the compressor 110 to optimize flow and lower energy consumption of the refrigerant system 100. In some implementations, the controller 202 also controls the speed of a compressor fan (not shown). In some implementations, the controller 202 receives input signals (e.g., temperature measurements, electric current draw, refrigerant flow rate, and/or refrigerant pressure). In some implementations, the controller 202 analyzes the input signals to adjust a compressor fan speed and, a condenser fan speed, and/or a liquid pump speed. Thus, in accordance with some implementations, the controller 202 ensures that the system is utilizing the least amount of electrical power as possible in order to maintain optimal temperature of the electronic components 114.

In some implementations, the refrigerant system 100 also includes a power source (not shown) for powering one or more components of the system, such as the condenser 102, the expansion device 106, the compressor 110, and the like. In some implementations, the power source is, or includes, a solar cell, an electrical battery, an alternator, or the like. In some implementations, the power source is belt driven from an internal combustion engine of a vehicle. In some implementations, the refrigerant system 100 includes a power management system (e.g., a battery management system) for managing various components of the system, such as power source. In some implementations, the power management system governs an amount of power drawn by each component of the refrigerant system 100.

In some implementations, the refrigerant system further includes an electronic valve to inject refrigerant from a refrigerant reservoir (e.g., fluid reservoir 602, FIG. 6) into the refrigerant system when a refrigerant charge level is below a predetermined refrigerant charge level. As an example, the electronic valve may be installed at the receiver drier. In some implementations, the electronic valve is selectively operated to allow flow of the refrigerant from the refrigerant reservoir to the refrigerant circuit.

In some implementations, the refrigerant system 100 is communicatively coupled to an electronic device and/or a server system (not shown). In some implementations, the electronic device comprises a display, a user interface, a smartphone, and/or a computer. In some implementations, the electronic device is located in proximity with the refrigerant system 100. For example, the refrigerant system is installed in a vehicle and the electronic device is a display on the dashboard of the vehicle. In some implementations, the electronic device is located remotely from the refrigerant system. For example, the refrigerant system is installed in a vehicle and the electronic device is a device not connected with the vehicle, such as a smartphone or a computer at a dealer. In some implementations, the controller outputs one or more signals to the electronic device. In some implementations, the signals optionally include data (e.g., the electric current drawn by a particular component, the refrigerant charge level, and the like), alerts (e.g., excessive current drawn by a particular component, excessive temperature for a particular component or the electronics component 114, and the like), maintenance request, and the like.

In some implementations, the refrigerant system includes one or more additional components such as air blowers, metering devices, flow control valves, and the like. In accordance with some implementations, FIG. 1 illustrates the refrigerant system including a condenser fan 104 (sometimes called a condenser blower) positioned proximate the condenser 102. In some implementations, the condenser fan 104 comprises one or more individual fans. In some implementations, the condenser fan 104 is a component of the condenser 102. In some implementations, the condenser fan 104 is configured to blow ambient air over the condenser 102. The amount of airflow over the condenser 102 affects the temperature and pressure of the refrigerant at the high pressure side of the refrigerant circuit and hence the efficiency of the refrigerant system. Accordingly, in some implementations, to enhance the efficiency of the refrigerant system, the controller controls a speed of the condenser fan 104 based at least in part on the temperature and/or pressure of the refrigerant in the refrigerant loop.

In some implementations, the refrigerant system also includes a metering device disposed upstream of the expansion device 106 and configured for controlling flow of the refrigerant into the expansion device 106. In some implementations, the metering device comprises a thermal expansion valve (e.g., such as metering device 626, FIG. 6) or a capillary tube. In some implementations, the refrigerant system further includes a flow control valve disposed upstream of the compressor 110 and configured to selectively restrict or permit flow of the refrigerant to the compressor 110.

Figure 3:
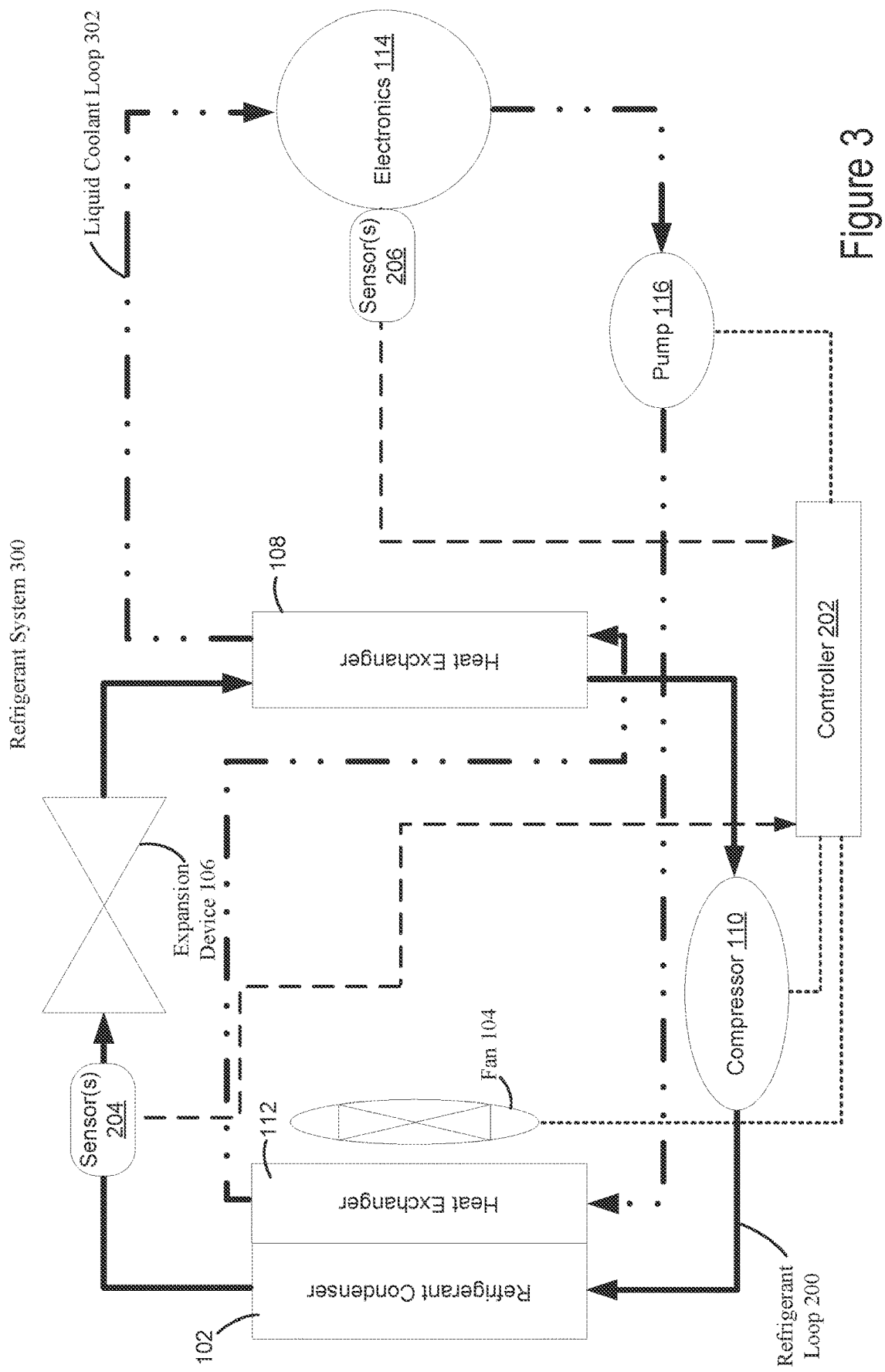
FIG. 3 is a block diagram illustrating another vehicular refrigerant system in accordance with some implementations.

FIG. 3 is a block diagram illustrating a refrigerant system 300 in accordance with some implementations. As shown in FIG. 3, the refrigerant system 300 includes the refrigerant loop 200 shown in FIG. 2 and a liquid coolant loop 302 for transferring heat from the electronics 114. The liquid coolant loop 302 includes the pump 116 for cycling liquid coolant through the liquid coolant loop, and, optionally, includes the second heat exchanger 112 for transferring heat between the liquid coolant and air (e.g., ambient air), and/or one or more sensors such as the sensor(s) 206 configured to monitor a temperature of the electronics. The heat exchanger 112 shown in FIG. 3 is upstream from the heat exchanger 108 and is positioned such that the air from the fan 104 is provided to the heat exchanger 112, thus enhancing a cooling of the liquid coolant in the heat exchanger 112. As one of skill in the art would recognize after having read the present disclosure, the heat exchanger 112 is optionally positioned in another configuration, e.g., remote from the condenser 102.

In accordance with some implementations, the liquid coolant loop 302 is arranged such that: an output of the pump 116 is fluidly connected to the heat exchanger 112 via a first liquid coolant connector; the heat exchanger 112 is fluidly connected to the heat exchanger 108 via a second liquid coolant connector; and the heat exchanger 108 is fluidly connected to the pump 116 via a third liquid coolant connector (e.g., with the sensor(s) 206 and the electronics 114 coupled to the third liquid coolant connector). In accordance with some implementations, the refrigerant loop 200 and the liquid coolant loop 302 are arranged such that the heat exchanger 112 is positioned adjacent to the refrigerant condenser 102 and the fan 104 is positioned to blow air across both the heat exchanger 112 and the refrigerant condenser 102.

In some implementations, the controller 202 receives input signals (e.g., temperature, current, flow rate, and/or pressure data) from various sensors (e.g., the sensors 204 and 206) and various components (e.g., the electronics 114, the compressor 110, and the pump 116), and uses this information to adjust a speed of the compressor 110, a speed of the fan 104, and/or a speed of the pump 116. In accordance with some implementations, the controller 202 thereby ensures that the system is utilizing the least amount of electrical power as possible in order to maintain optimal temperature of the electronic components.

The configuration shown in FIG. 3 allows for the refrigerant system to be disabled when the electronic components do not require active cooling, thereby reducing a duty cycle of the compressor. Additionally, this configuration enables pre-cooling of the liquid coolant via the heat exchanger 112 before it enters the liquid-to-refrigerant heat exchanger 108, again lowering required electrical power to achieve optimum temperature of the electrical components.

Figure 4:
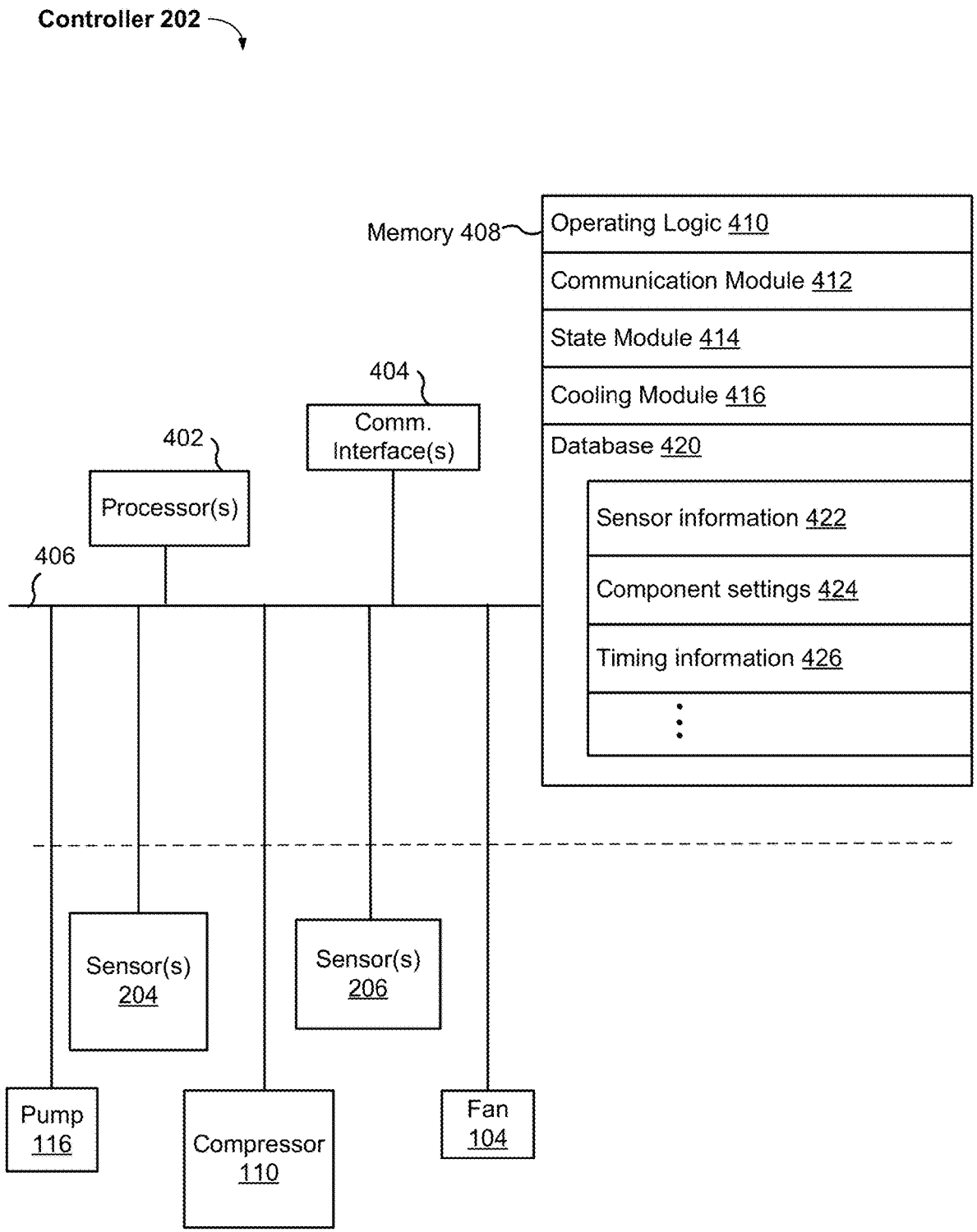
FIG. 4 is a block diagram illustrating a representative controller in accordance with some implementations.

FIG. 4 is a block diagram illustrating a representative controller 202 in accordance with some implementations. In some implementations, the controller 202 includes one or more processing units (e.g., CPUs, ASICs, FPGAs, microprocessors, and the like) 402, one or more communication interfaces 404, memory 408, and one or more communication buses 406 for interconnecting these components (sometimes called a chipset). In some implementations, the controller 202 includes one or more input devices, such as one or more buttons for receiving input. In some implementations, the controller 202 includes one or more output devices, such as one or more indicator lights, a sound card, a speaker, a display for displaying textual information and error codes, etc. In some implementations, the controller 202 includes a location detection device, such as a GPS (global positioning satellite) or other geo-location receiver, for determining the location of the controller 202. In accordance with some implementations, the controller 202 is coupled to the pump 116, the sensor(s) 204, the compressor 110, the sensor(s) 206, and the fan 104, as shown in FIG. 2. In some implementations, the controller 202 is communicatively coupled to a display (e.g., a display mounted in the vehicle, a display of a user device such as a cellphone or tablet, or a display mounted to the controller 202).

The communication interfaces 404 include, for example, hardware capable of data communications using any of a variety of custom or standard wireless protocols (e.g., IEEE 802.15.4, Wi-Fi, ZigBee, 6LoWPAN, Thread, Z-Wave, Bluetooth Smart, ISA100.11a, WirelessHART, MiWi, etc.) and/or any of a variety of custom or standard wired protocols (e.g., Ethernet, HomePlug, etc.), or any other suitable communication protocol, including communication protocols not yet developed as of the filing date of this document.

The memory 408 includes high-speed random access memory, such as DRAM, SRAM, DDR SRAM, or other random access solid state memory devices; and, optionally, includes non-volatile memory, such as one or more magnetic disk storage devices, one or more optical disk storage devices, one or more flash memory devices, or one or more other non-volatile solid state storage devices. The memory 408, or alternatively the non-volatile memory within memory 408, includes a non-transitory computer-readable storage medium. In some implementations, the memory 408, or the non-transitory computer-readable storage medium of memory 408, stores the following programs, modules, and data structures, or a subset or superset thereof:

Operating logic 410 including procedures for handling various system services and for performing hardware dependent tasks;
Communication module 412 for coupling to and communicating with other network devices via one or more networks, e.g., in conjunction with the one or more communication interfaces 404;
State module 414 for determining an operating state of the system (e.g., of refrigerant system 100, FIG. 1) and/or for setting/adjusting the operating state of the system;
Cooling module 416 for managing cooling operations of the system (e.g., temperature settings, fan speeds, power settings, etc.), e.g., in conjunction with state module 414;
Error module 418 for determining whether one or more error conditions are present and/or conveying the one or more error conditions to a user of the system and/or initiating remedial action in response to the one or more error conditions; and
Database 420, including but not limited to:
Sensor information 422 for storing and managing data received, detected, and/or transmitted by one or more sensors of the system (e.g., sensor(s) 204 and/or sensor(s) 206, FIG. 2);
Component settings 424 for storing and managing operational settings for one or more components of the system (e.g., condenser 102, compressor 110, and pump 116); and Timing information 426 for storing and managing timing information related to operation and/or testing of the system.

Each of the above identified elements (e.g., modules stored in the memory 408 of controller 202) corresponds to a set of instructions for performing a function described herein. The above identified modules or programs (i.e., sets of instructions) need not be implemented as separate software programs, procedures, or modules, and thus various subsets of these modules may be combined or otherwise rearranged in various implementations. In some implementations, the memory 408, optionally, stores a subset of the modules and data structures identified above. Furthermore, the memory 408, optionally, stores additional modules and data structures not described above. For example, the memory 408 optionally stores a heating module (not shown) for managing heating operations of the system.

Figure 5A:
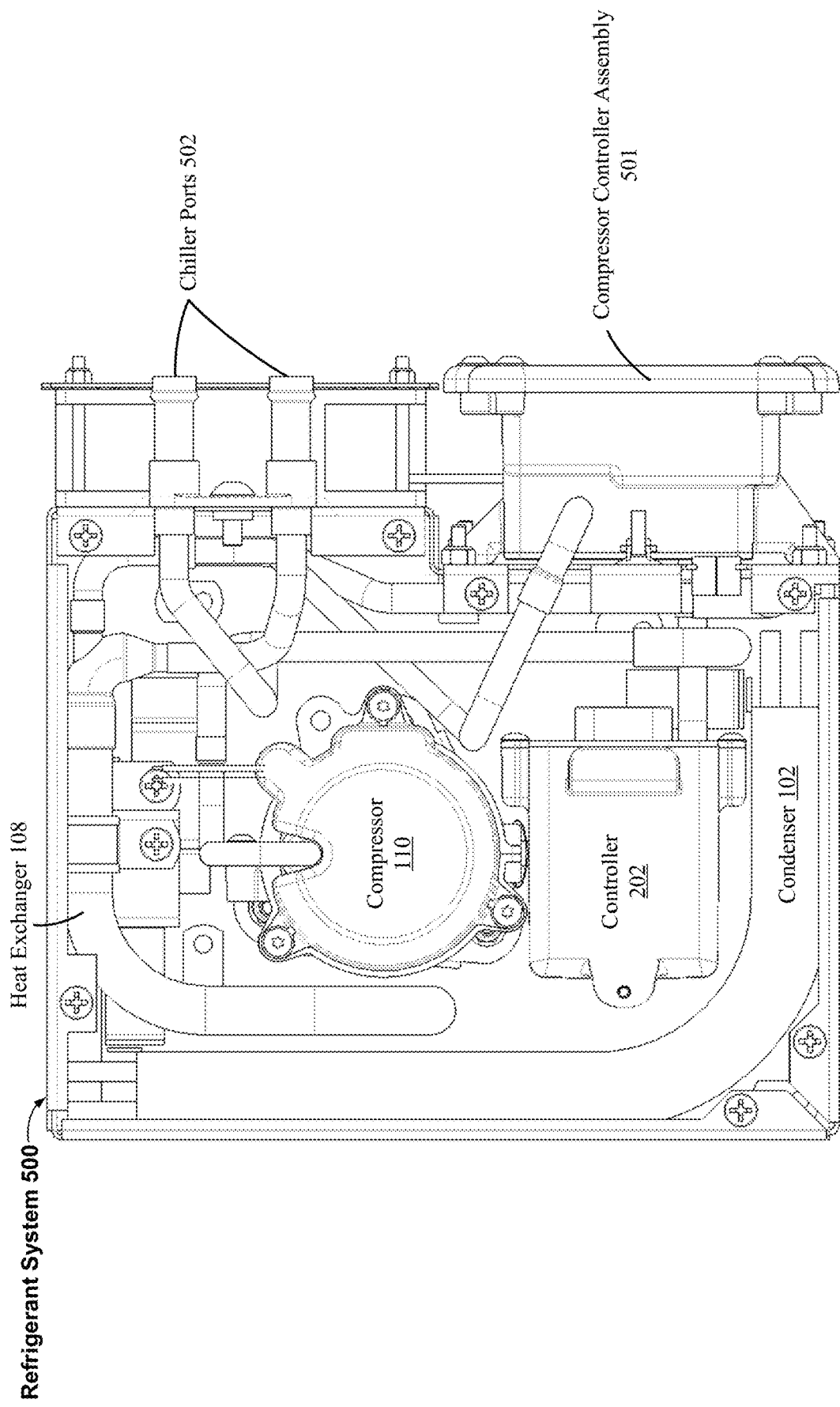

FIGS. 5A-5K are component drawings illustrating components of a refrigerant system 500 (e.g., the refrigerant system 100 or 300) in accordance with some implementations. FIG. 5A shows a top-down view of the refrigerant system 500 including the compressor 110, the controller 202, the condenser 102, the heat exchanger 108, a compressor controller assembly 501, and chiller ports 502 (e.g., for coupling to the electronics 114 via the liquid coolant loop 201). In some implementations, the compressor controller assembly 501 includes a liquid-gas separator with electronics cooling. The liquid-gas separator is configured to transfer heat generated by the compressor controller electronics to the refrigerant, resulting in hotter refrigerant (e.g., gaseous refrigerant) and cooler electronics. More details regarding the liquid-gas separator can be found in U.S. patent application Ser. No. 15/283,150, filed Sep. 30, 2016, entitled "Refrigerant Liquid-gas Separator with Electronics Cooling," which is hereby incorporated by reference in its entirety. In some implementations, the chiller ports 502 couple with liquid coolant loop 201 (e.g., couple to the heat exchanger 112 and/or the liquid coolant pump 116). In some implementations, the condenser 102 is an L-shaped condenser. In some implementations, the condenser 102 includes a tube-fin condenser coil, e.g., an L-shaped tube-fin condenser coil. In some implementations, the refrigerant system 100 includes a brass bulkhead with copper ends.

Figure 5B:
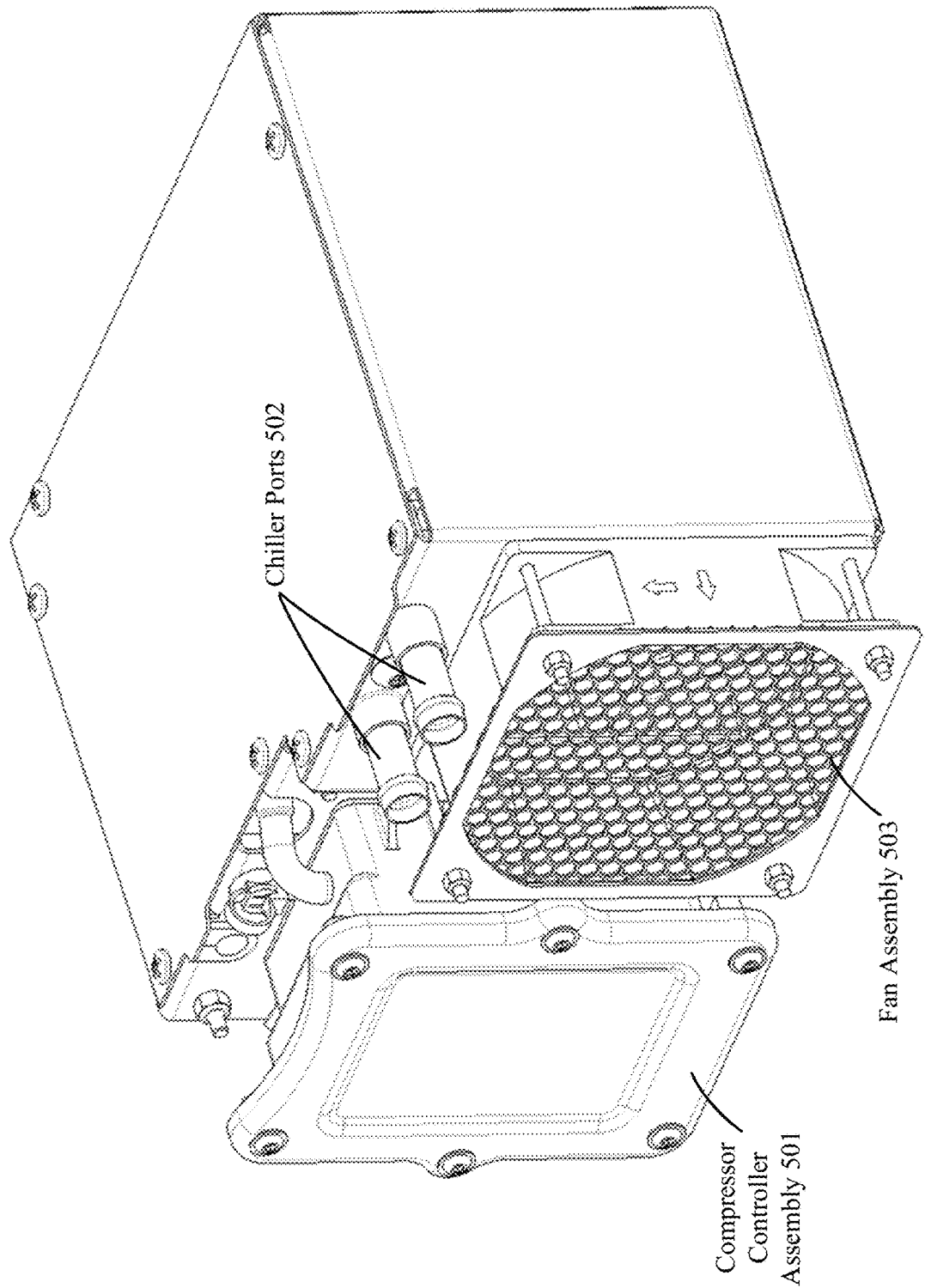

FIG. 5B shows a perspective view of the refrigerant system 500 in accordance with some implementations. As shown in FIG. 5B the refrigerant system 500 includes a fan assembly 503. In some implementations, the fan assembly 503 includes an air outlet, such as the filtered air outlet shown in FIG. 5B. In some implementations, the fan assembly 503 includes an exhaust fan to blow air out of the refrigerant system 500. In some implementations, the fan assembly 503 includes a condenser fan, such as the fan 104 in FIG. 1. In some implementations, the refrigerant system 500 is configured such that a front side of the refrigerant system (e.g., as shown in FIG. 5J) is aligned with a front side of a vehicle to which the refrigerant system is mounted, e.g., to facilitate air flow into the air intakes 504 while the vehicle is moving forward.

Figure 5C:
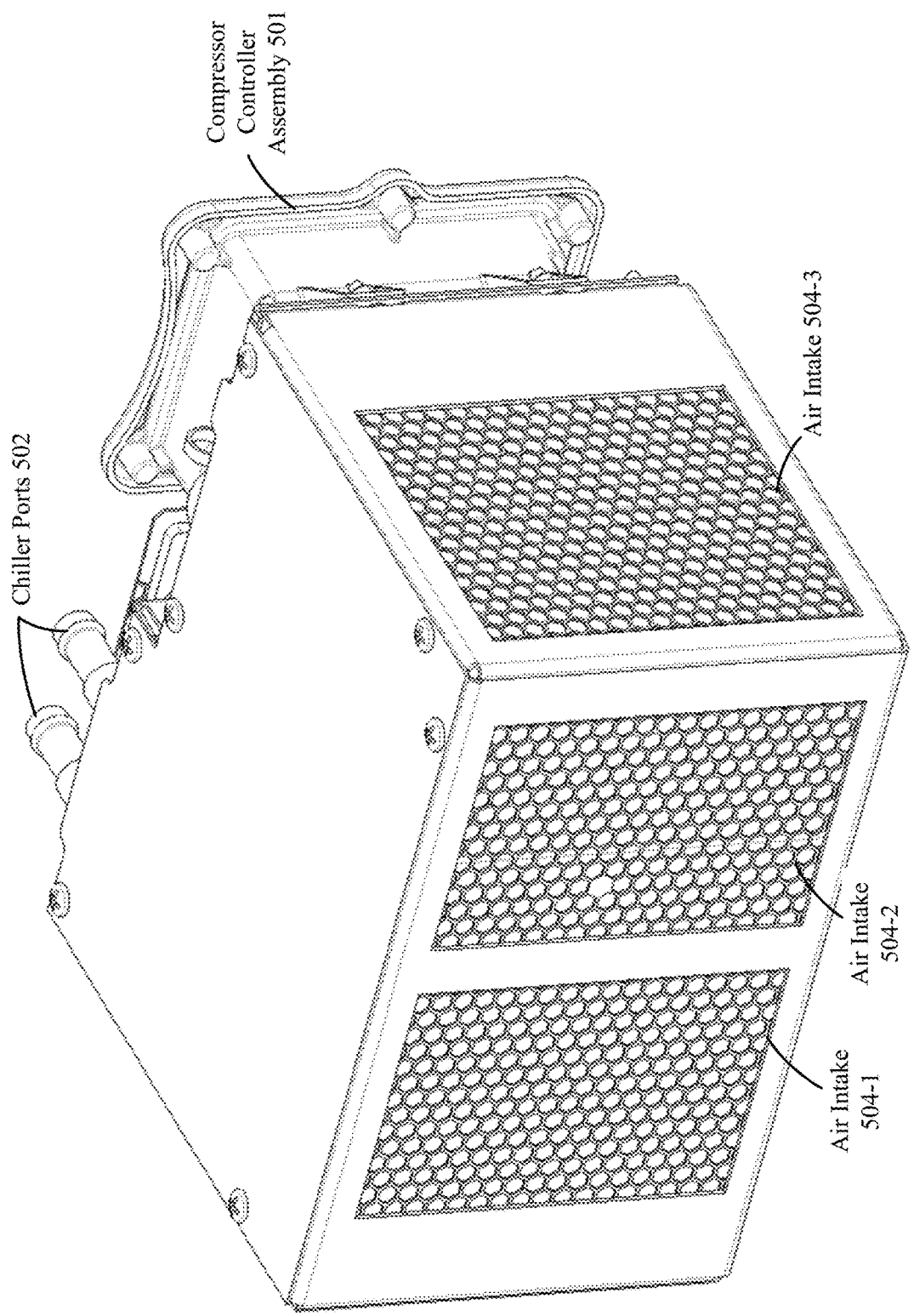
Figure 5D:
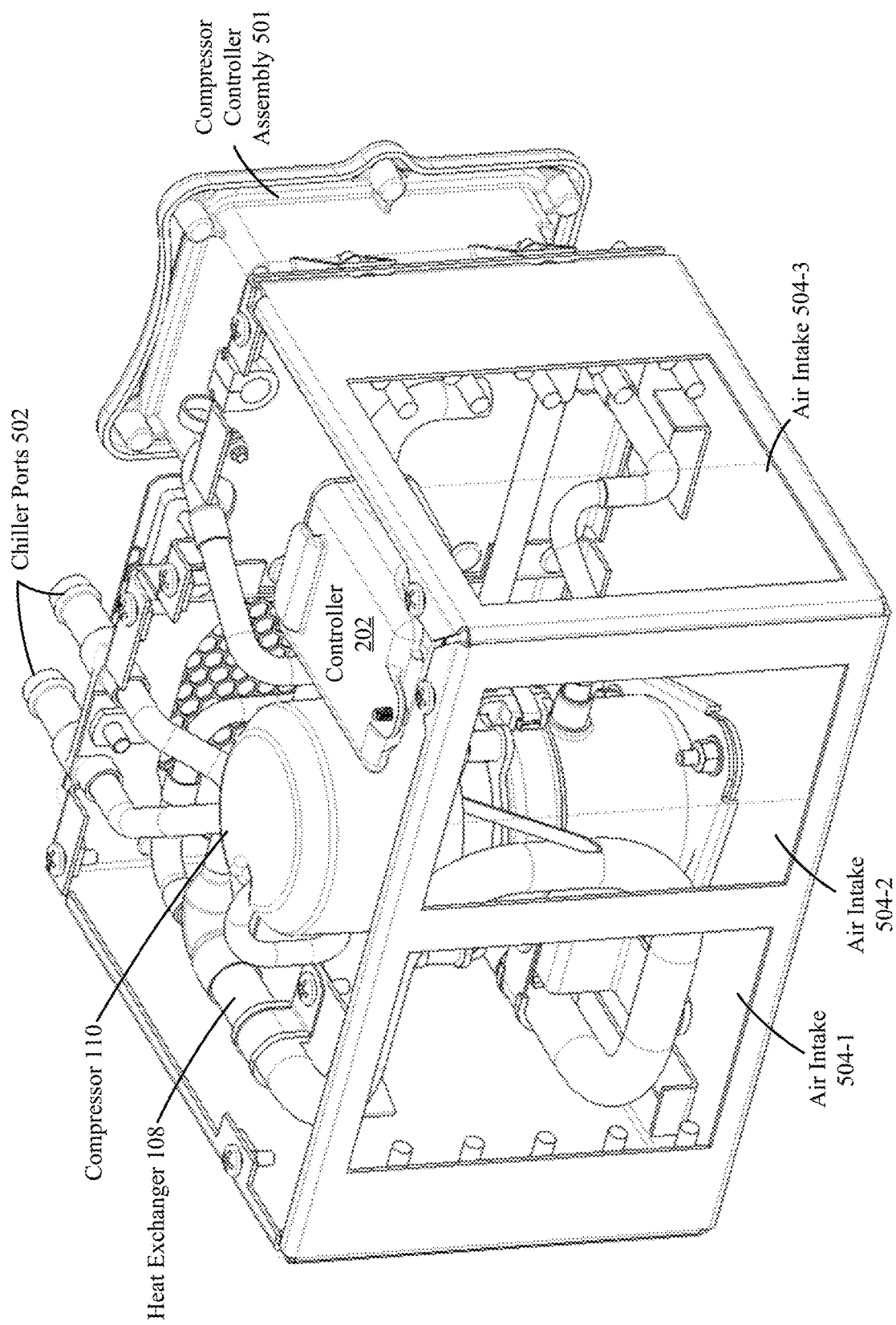
Figure 5E:
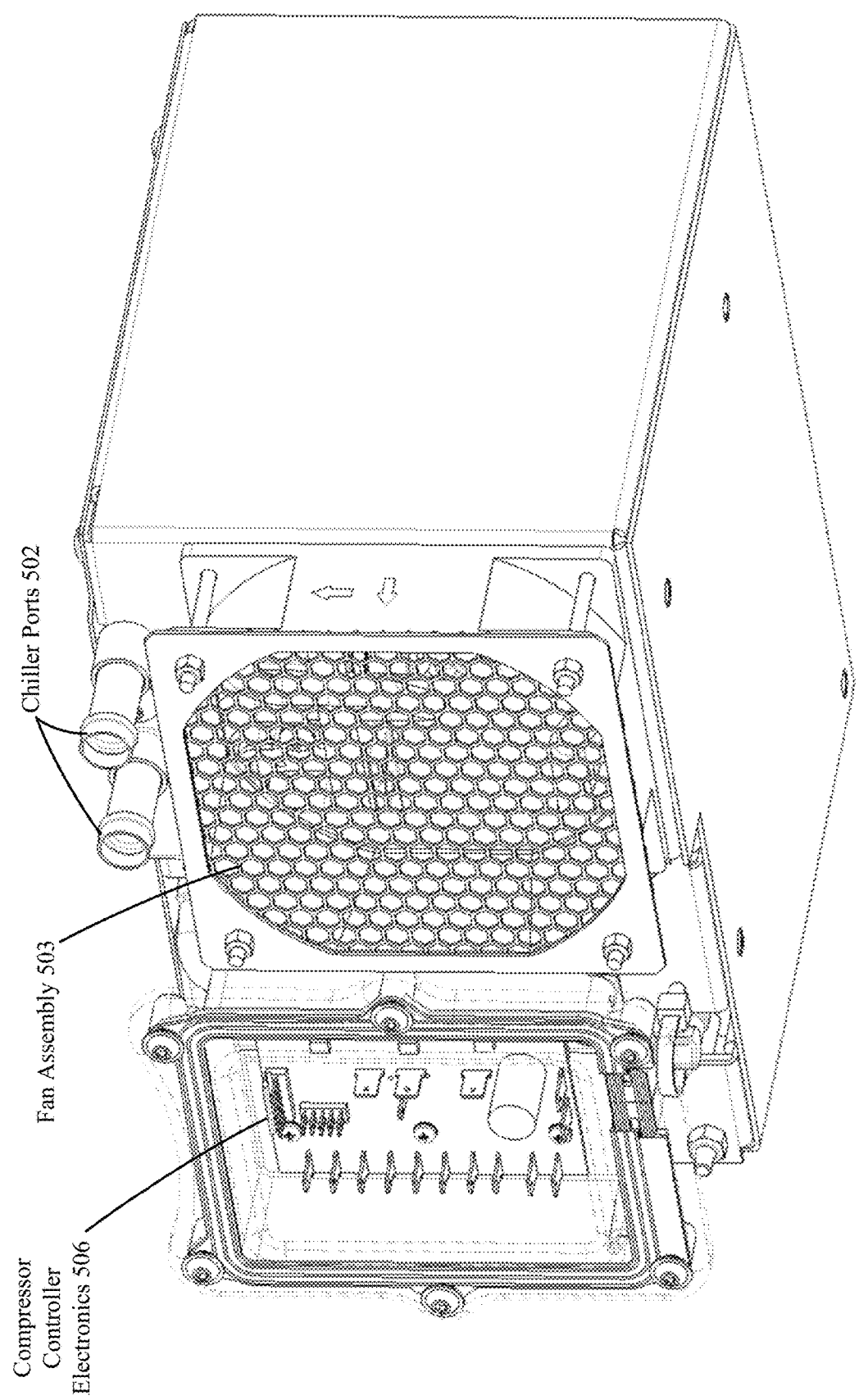
Figure 5F:
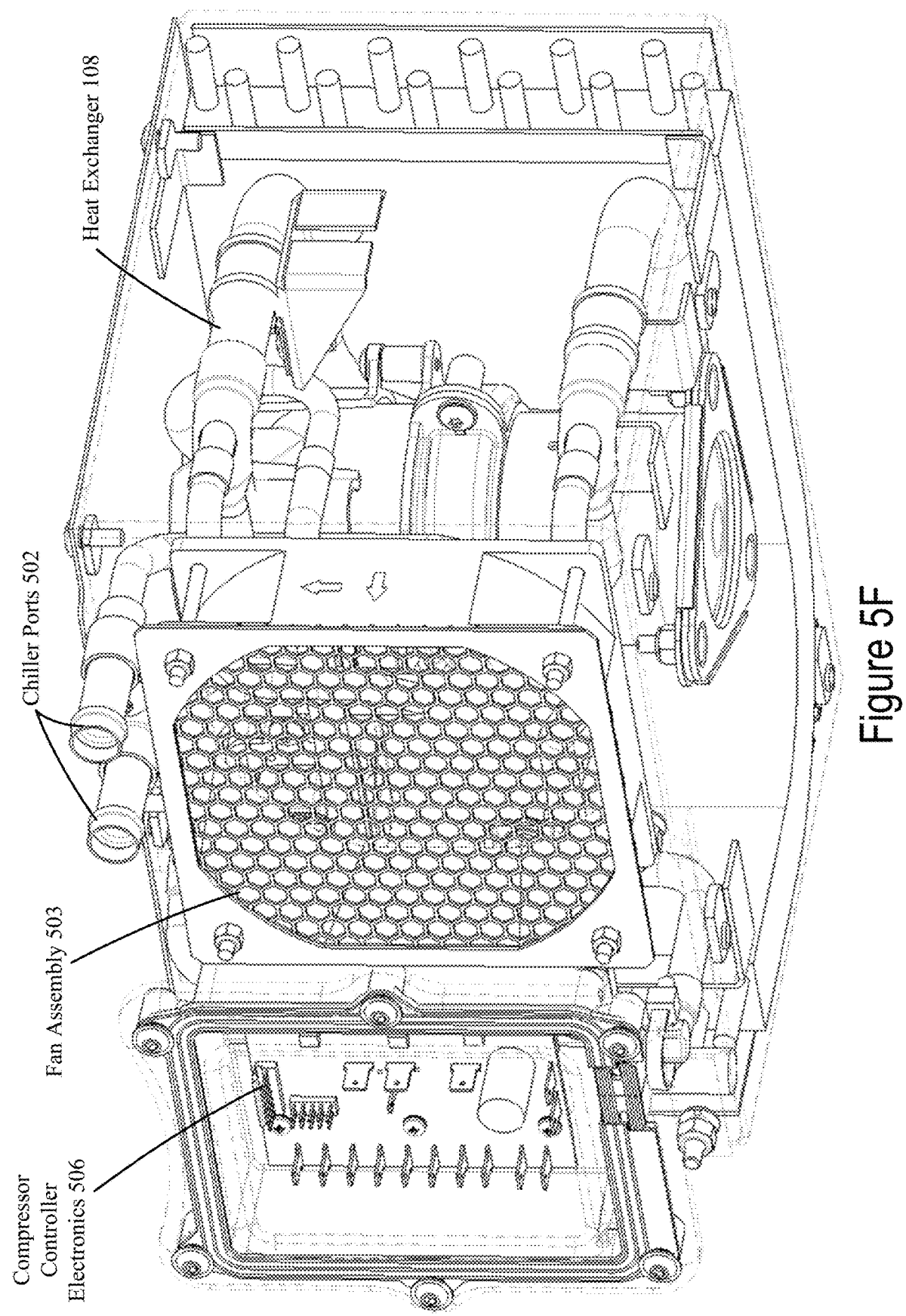
Figure 5I:
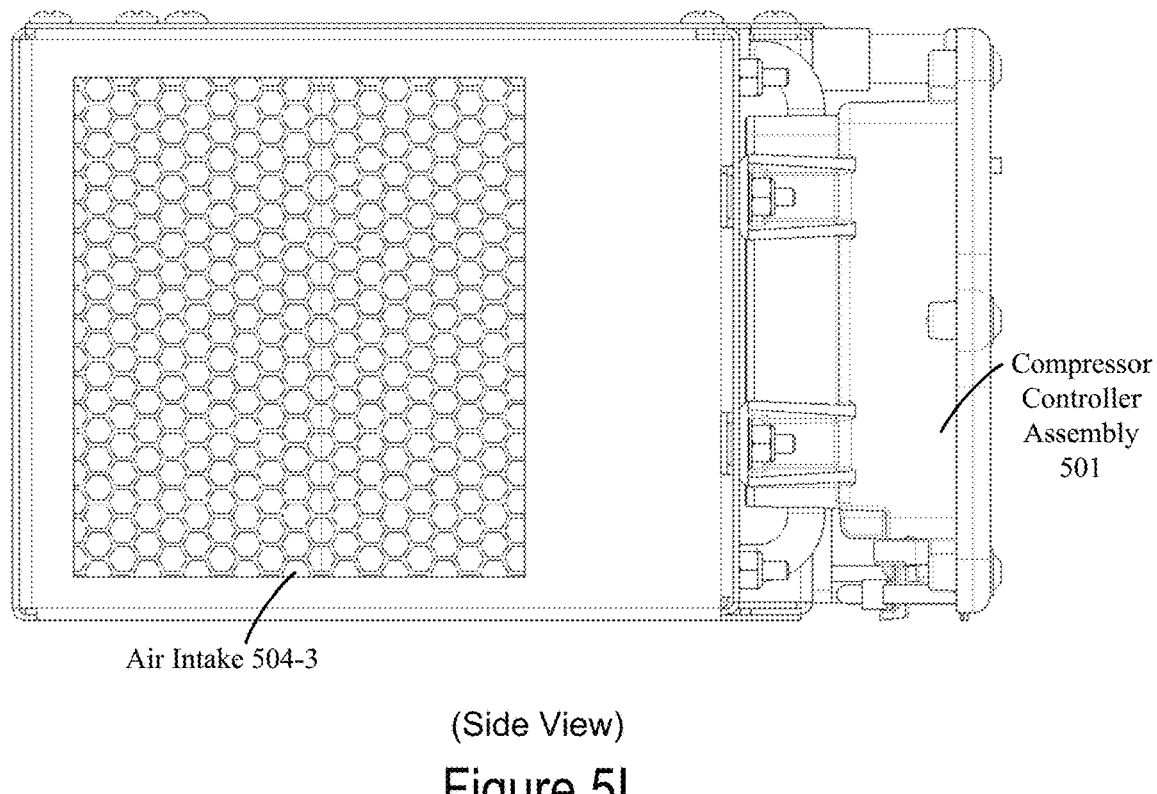
Figure 5J:
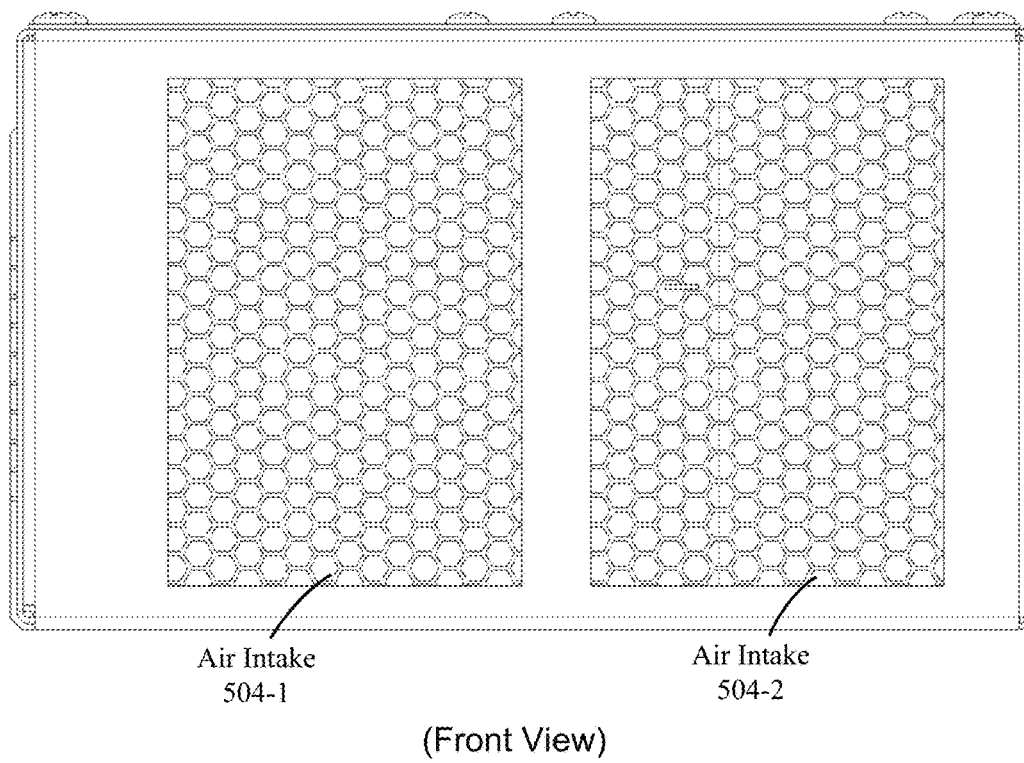

FIGS. 5C-5D show another perspective view of the refrigerant system 500 in accordance with some implementations. As shown in FIGS. 5C-5D the refrigerant system 500 includes air intakes 504 (e.g., air intakes 504-1, 504-2, and 504-3). In some implementations, the air intakes 504 are covered by respective filters (as shown in FIG. 5C). In accordance with some implementations, the air intakes 504 are positioned so that air flowing into the air intakes 504 passes over the condenser 102 (e.g., the air intakes 504 are adjacent to the condenser 102). As shown in FIGS. 5A and 5D, in some implementations, the condenser 102 is shaped and positioned to be adjacent to the air intakes 504. FIGS. 5E-5F show another perspective view of the refrigerant system 500 including compressor controller electronics 506 positioned within the compressor controller assembly 501. FIGS. 5G and 5H show top and bottom views of the refrigerant system 500 and FIGS. 5I-5K show side, front, and back views of the refrigerant system 500 respectively.

Figure 6:
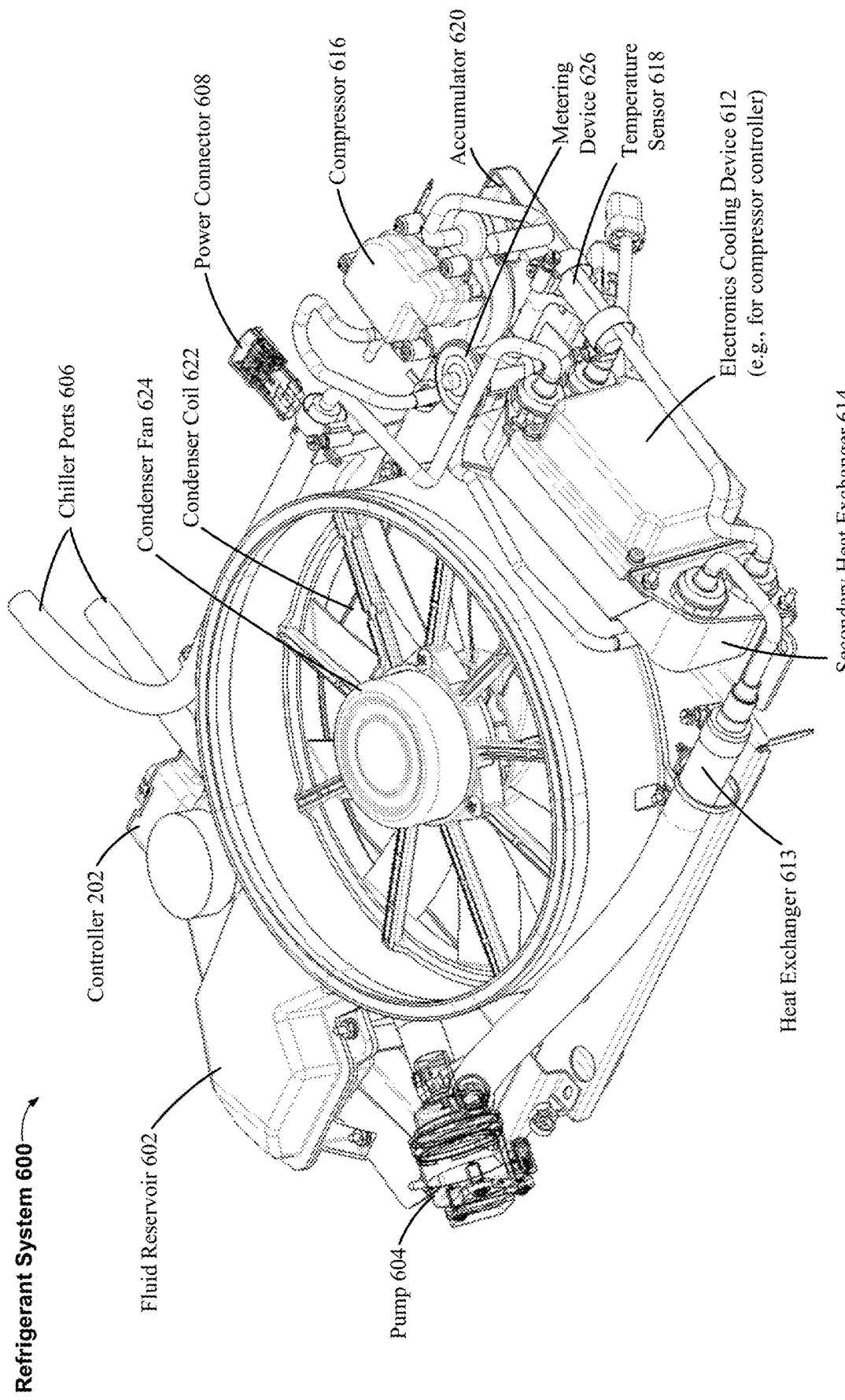
FIG. 6 is a component drawing illustrating components of another representative refrigerant system in accordance with some implementations.

FIG. 6 is a component drawing illustrating components of a refrigerant system 600 (e.g., the refrigerant system 100 or 300) in accordance with some implementations. The refrigerant system 600 includes a refrigerant loop coupling a compressor 616 (e.g., the compressor 110), a condenser coil 622 (e.g., corresponding to the condenser 102), a condenser fan 624 (e.g., the fan 104), a metering device 626 (e.g., a thermal expansion valve), and an accumulator 620. The refrigerant system 600 further includes a liquid coolant loop coupling a liquid coolant pump 604 (e.g., the pump 116), a secondary heat exchanger 614 (e.g., the heat exchanger 112), and chiller ports 606 for coupling with electronics to be cooled (e.g., the electronics 114). The refrigerant system 600 further includes heat exchanger 613 (e.g., for exchanging heat between the refrigerant and the liquid coolant), an electronics cooling device 612 (e.g., a liquid-gas separator with electronics cooling as described above with respect to FIG. 5A), a temperature sensor 618 (e.g., for determining a temperature of the refrigerant), a fluid reservoir 602 for storing refrigerant and/or liquid coolant, and a power connector 608 (e.g., for coupling with a power source such as a battery, solar panel, electric engine, or gas-powered engine). In some implementations, system electronics (e.g., compressor controller electronics) are arranged within the electronics cooling device 612. In some implementations, the condenser coil 622 is composed of aluminum or an aluminum alloy for increased thermal conductivity and reduced weight (e.g., as compared to other metals). In some implementations, the compressor 616 is a micro-compressor configured to reduce a profile of the system 600 while providing adequate cooling for coupled electronics. In some implementations, the condenser fan 624 is a brushless fan. In some implementations, the fan 624 is positioned to move air in a substantially vertical direction (e.g., with 10 degrees, 20 degrees, or 30 degrees of vertical) when mounted and operating on a vehicle. In some implementations, the fan 624 is positioned and configured to exhaust air upward and outward from the refrigerant system 600 when mounted on a vehicle. In some implementations, the fan 624 is positioned and configured to pull air past the condenser coil 622 and push it up and away from a vehicle to which the refrigerant system 600 is mounted. In some implementations, the liquid coolant loop of the refrigerant system 600 is a self-contained liquid coolant loop. In some implementations, the system 600 is configured to couple to, and cool, one or more of: electronic components, motors, and batteries via chiller ports 606.

In some implementations, the system 600 includes a casing (not shown), e.g., a casing adapted to be aerodynamic when arranged on a roof of a vehicle. In accordance with some implementations, the system 600 is arranged and configured to have a low profile so as to reduce drag on a vehicle when mounted to a roof, hood, or side of the vehicle.

Figure 7:
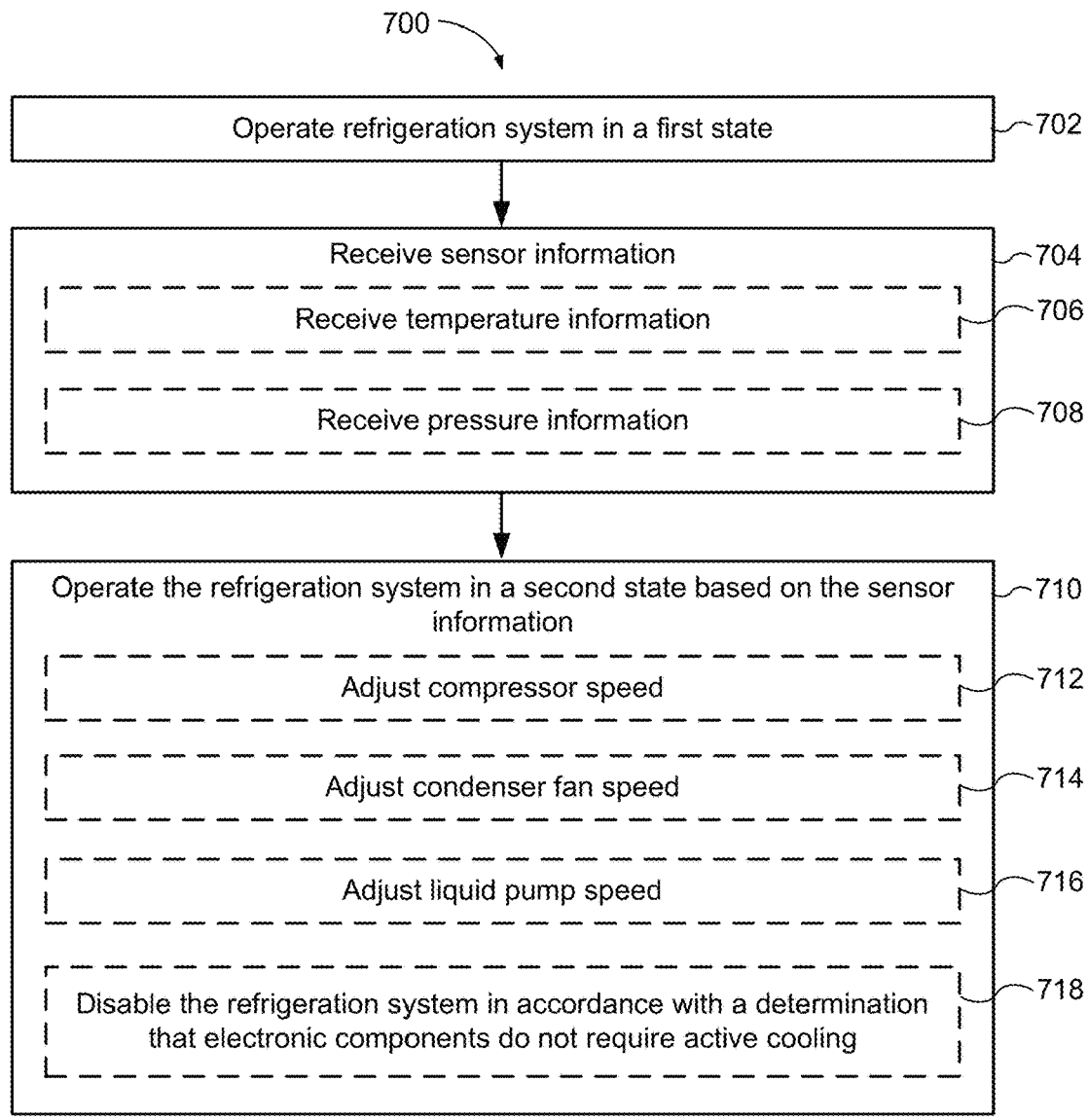
FIG. 7 is a flow diagram illustrating a method for cooling an electronics system in accordance with some implementations.

FIG. 7 is a flowchart diagram illustrating a method 700 for cooling electronics in accordance with some implementations. In some implementations, the method 700 is performed by a refrigerant system (e.g., the refrigerant system 100 or 300) or one or more components of the refrigerant system, such as the controller 202, FIG. 2. In some implementations, the method 700 is performed by a device or controller coupled to the refrigerant system. Thus, in some implementations, the operations of the method 700 described herein are interchangeable, and respective operations of the method 700 are performed by any of the aforementioned devices, systems, or combination of devices and/or systems. In some implementations, the method 700 is governed by instructions that are stored in a non-transitory computer-readable storage medium and that are executed by one or more controllers of a refrigerant system. For convenience, method 700 is described below as being performed by a system, such as the refrigerant system 100 in FIG. 1.

A system having a refrigeration loop and a liquid coolant loop (e.g., refrigerant system 100) operates (702) in a first state. In some implementations, the first state corresponds to a particular condenser fan speed, compressor compression ratio, and/or liquid coolant pump speed.

The system receives (704) sensor information (e.g., receives the sensor information from the sensor(s) 204 and/or sensor(s) 206 in FIG. 2). In some implementations, the system receives (706) temperature information. In some implementations, the system receives (708) pressure information. In some implementations, the system receives information on one or more of: component temperature, ambient temperature, refrigerant temperature, refrigerant pressure, refrigerant flow rate, liquid coolant pressure, liquid coolant temperature, and component current draw.

The system operates (710) in a second state based on the sensor information. In some implementations, a controller (e.g., controller 202) transitions the system from operating in the first state to operating in the second state based on the sensor information. In some implementations, the second state corresponds to a parameter, such as condenser fan speed, compressor compression ratio, and/or liquid coolant pump speed, distinct from the corresponding parameter in the first state. In some implementations, operating in the second state includes adjusting (712) a compressor speed. In some implementations, operating in the second state includes adjusting (714) a condenser fan speed. In some implementations, operating in the second state includes adjusting (716) a liquid coolant pump speed. In some implementations, the controller adjusts component speed (e.g., compressor speed) by modifying a current and/or voltage supplied to the component.

In some implementations, operating in the second state includes disabling (718) at least a portion of the refrigerant system in accordance with a determination that associated electronic components do not require active cooling. For example, disabling the compressor 110. In some implementations, the refrigerant system (e.g., refrigerant system 100) includes one or more bypasses to route the refrigerant around disabled component(s).

In some implementations, the system modulates the compressor speed to minimize power consumption. In some implementations, the system modulates the condenser fan speed to minimize power consumption. In some implementations, the system modulates the coolant pump to minimize power consumption. In some implementations, the system monitors conditions (e.g., periodically or continuously monitors) and modulates any one of the above components to meet performance needs and to minimize power consumption (e.g., and extend battery life of the system).

In some implementations, the system includes a refrigerant loop (e.g., refrigerant loop 200), but does not include a liquid coolant loop. For example, the system includes a refrigerant loop with a cold plate rather than the heat exchanger 108 in some implementations. In this example, the cold plate is configured to cool (e.g., transfer heat from) the electronics. In some implementations, the system includes a cooling component (e.g., a cold plate) for the electronics and does not include a liquid coolant loop. In some implementations, the cooling component is coupled to the refrigerant loop. In some implementations, the system includes the refrigerant loop coupled via the heat exchanger to a liquid coolant interface (e.g., a substantially stationary liquid coolant) with the electronics.

It should be understood that the particular order in which the operations in FIG. 7 have been described is merely an example and is not intended to indicate that the described order is the only order in which the operations could be performed. One of ordinary skill in the art would recognize various ways to reorder the operations described herein. Additionally, it should be noted that details of other processes described herein with respect to other methods and/or processes described herein are also applicable in an analogous manner to the method 700 described above with respect to FIG. 7.

Although some of various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages could be implemented in hardware, firmware, software or any combination thereof.

It will also be understood that, although the terms first, second, etc. are, in some instances, used herein to describe various elements, these elements should not be limited by these terms. These terms are only used to distinguish one element from another. For example, a first sensor could be termed a second sensor, and, similarly, a second sensor could be termed a first sensor, without departing from the scope of the various described implementations. The first sensor and the second sensor are both sensors, but they are not the same sensor unless explicitly described as such.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The foregoing description, for purpose of explanation, has been described with reference to specific implementations. However, the illustrative discussions above are not intended to be exhaustive or to limit the scope of the claims to the precise forms disclosed. Many modifications and variations are possible in view of the above teachings. The implementations were chosen in order to best explain the principles underlying the claims and their practical applications, to thereby enable others skilled in the art to best use the implementations with various modifications as are suited to the particular uses contemplated.

What is claimed is:

1. A vehicular electronics cooling system, comprising:
  a refrigerant loop;
  a liquid coolant loop thermally coupled to the refrigerant loop such that heat transfers from a liquid coolant in the liquid coolant loop to a refrigerant in the refrigerant loop;
  an electronics system thermally coupled to the liquid coolant loop such that heat transfers from the electronics system via the liquid coolant in the liquid coolant loop, wherein the electronics system is at least partially externally mounted on a vehicle; and
  a controller communicatively coupled to the refrigerant loop, the liquid coolant loop, and the electronics system, the controller configured to:
    obtain operating data from the electronics system indicative of cooling requirements of the electronics system; and
    adjust a speed of one or more components of the vehicular electronics cooling system based on the operating data.

2. The vehicular electronics cooling system of claim 1, wherein the operating data includes information regarding one or more of: a temperature of the electronics system, a temperature of the refrigerant, a pressure of the refrigerant, and a temperature of the liquid coolant.

3. The vehicular electronics cooling system of claim 1, wherein adjusting the speed of the one or more components includes one or more of adjusting a compressor compression ratio, adjusting a compressor speed, adjusting a condenser fan speed, and adjusting a liquid coolant pump speed.

4. The vehicular electronics cooling system of claim 1, wherein adjusting the speed of the one or more components includes disabling one or more of a compressor, a condenser fan, and a liquid coolant pump in accordance with a determination that a temperature of the electronics system is below a threshold temperature.

5. The vehicular electronics cooling system of claim 1, wherein the refrigerant loop and the liquid coolant loop are thermally coupled via a heat exchanger.

6. The vehicular electronics cooling system of claim 1, further comprising:
  a first sensor configured to monitor operation of the refrigerant loop;
  a second sensor configured to monitor operation of the liquid coolant loop;
  wherein:
    the operating data includes first sensor data obtained from the first sensor and second sensor data obtained from the second sensor, and
    adjusting the speed of one or more components of the vehicular electronics cooling system is based on a combination of the operating data, the combination including (i) the operating data from the electronics system indicative of cooling requirements of the electronics system, (ii) the first sensor data,. and/or (iii) second sensor data.

7. The vehicular electronics cooling system of claim 6, wherein the first sensor is part of a first set of sensors including one or more temperature sensors thermally coupled to the refrigerant loop and the second sensor is part of a second set of sensors including one or more temperature sensors thermally coupled to one or more of: the liquid coolant loop and the electronics system.

8. The vehicular electronics cooling system of claim 6, wherein the operating data comprises electric current data from the compressor.

9. The vehicular electronics cooling system of claim 6, wherein the operating data comprises information regarding a refrigerant charge level.

10. The vehicular electronics cooling system of claim 1, wherein the controller is further configured to adjust a charge level of the refrigerant loop in accordance with the operating data.

11. The vehicular electronics cooling system of claim 1, wherein the controller is communicatively coupled to a display and is configured to transmit system data to the display for presentation to a user.

12. The vehicular electronics cooling system of claim 1, wherein the electronics system is at least partially mounted on a roof, hood, or side of the vehicle.

13. A method for cooling an electronics system, comprising:
  at a vehicular electronics cooling system comprising a refrigerant loop, a liquid coolant loop thermally coupled to the refrigerant loop, and the electronics system is at least partially externally mounted on a vehicle and thermally coupled to the liquid coolant loop:
    cooling the electronics system by operating the vehicular electronics cooling system in a first state;
    while operating the vehicular electronics cooling system in the first state, obtaining operating data from the electronics system indicative of cooling requirements of the electronics system; and
    adjusting operation of the vehicular electronics cooling system from the first state to a second state based on the operating data obtained from the electronics system.

14. The method of claim 13, wherein adjusting operation of the vehicular electronics cooling system includes adjusting a compressor speed.

15. The method of claim 13, wherein adjusting operation of the vehicular electronics cooling system includes adjusting a condenser fan speed.

16. The method of claim 13, wherein adjusting operation of the vehicular electronics cooling system includes adjusting a pump speed for a liquid coolant pump of the vehicular electronics cooling system.

17. The method of claim 13, wherein the operating data includes information regarding one or more of: a temperature of the electronics system, a temperature of the liquid coolant, and a temperature of a refrigerant of the vehicular electronics cooling system.

18. The method of claim 13, wherein the operating data includes information regarding a pressure or flow rate of refrigerant in the vehicular electronics cooling system.

19. The method of claim 13, wherein the operating data indicates that the electronics system does not require active cooling; and wherein adjusting operation of the vehicular electronics cooling system includes disabling a portion of the refrigerant loop of the vehicular electronics cooling system.

20. The method of claim 19, wherein disabling the portion of the refrigerant loop of the vehicular electronics cooling system includes disabling a compressor.

21. The method of claim 19, wherein disabling the portion of the vehicular electronics cooling system includes disabling the refrigerant loop of the vehicular electronics cooling system while maintaining operation of the liquid coolant pump of the vehicular electronics cooling system.

* * * * *